(12) United States Patent
Hwang et al.

(10) Patent No.: US 9,331,272 B2
(45) Date of Patent: May 3, 2016

(54) 3-DIMENSIONAL (3D) NON-VOLATILE MEMORY DEVICE AND METHOD OF FABRICATING THE SAME

(75) Inventors: Cheol Seong Hwang, Seoul (KR); Jun Yeong Seok, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 62 days.

(21) Appl. No.: 14/125,198

(22) PCT Filed: Jun. 11, 2012

(86) PCT No.: PCT/KR2012/004582
§ 371 (c)(1),
(2), (4) Date: Dec. 16, 2013

(87) PCT Pub. No.: WO2012/169850
PCT Pub. Date: Dec. 13, 2012

(65) Prior Publication Data
US 2014/0124729 A1 May 8, 2014

(30) Foreign Application Priority Data

Jun. 10, 2011 (KR) .................. 10-2011-0056207
Jun. 24, 2011 (KR) .................. 10-2011-0061665

(51) Int. Cl.
*H01L 29/02* (2006.01)
*H01L 45/00* (2006.01)
(Continued)

(52) U.S. Cl.
CPC ........ *H01L 45/1233* (2013.01); *H01L 27/0688* (2013.01); *H01L 27/101* (2013.01); *H01L 27/224* (2013.01); *H01L 27/228* (2013.01); *H01L 27/2409* (2013.01); *H01L 27/2454* (2013.01); *H01L 27/2481* (2013.01); *H01L 43/02* (2013.01); *H01L 43/12* (2013.01); *H01L 45/16* (2013.01); *H01L 45/04* (2013.01);
(Continued)

(58) Field of Classification Search
CPC ......... H01L 45/04; H01L 29/00; H01L 27/24; G11C 13/0004
USPC ................... 257/1–5, E29.002; 438/102–104
See application file for complete search history.

(56) References Cited

U.S. PATENT DOCUMENTS

| | | | |
|---|---|---|---|
| 2007/0103963 A1* | 5/2007 | Kim et al. ............ | 365/148 |
| 2007/0103972 A1* | 5/2007 | Ro et al. ............. | 365/163 |
| 2011/0121255 A1 | 5/2011 | Tang et al. | |

FOREIGN PATENT DOCUMENTS

| | | |
|---|---|---|
| KR | 20080092603 A | 10/2008 |
| KR | 20090105734 A | 10/2009 |

(Continued)

OTHER PUBLICATIONS

International Search Report mailed Jan. 29, 2013; PCT/KR2012/004582.

*Primary Examiner* — Jami M Valentine
(74) *Attorney, Agent, or Firm* — Ladas & Parry LLP

(57) ABSTRACT

Provided are 3D non-volatile memory devices and methods of fabricating the same. A 3D non-volatile memory device according to an embodiment of the present invention includes a plurality of conductive lines, which are separated from one another in parallel; a plurality of conductive planes, which extend across the plurality of conductive lines and are separated from one another in parallel; and non-volatile data storage layer patterns, which are respectively arranged at regions of intersection at which the plurality of conductive lines and the plurality of conductive planes cross each others.

9 Claims, 23 Drawing Sheets

(51) Int. Cl.
*H01L 27/06* (2006.01)
*H01L 27/10* (2006.01)
*H01L 27/24* (2006.01)
*H01L 43/02* (2006.01)
*H01L 43/12* (2006.01)
*H01L 27/22* (2006.01)

(52) U.S. Cl.
CPC ............... *H01L45/06* (2013.01); *H01L 45/085* (2013.01); *H01L 45/122* (2013.01); *H01L 45/143* (2013.01); *H01L 45/144* (2013.01); *H01L 45/146* (2013.01)

(56) References Cited

FOREIGN PATENT DOCUMENTS

| | | |
|---|---|---|
| KR | 20100024800 A | 3/2010 |
| KR | 20100049564 A | 5/2010 |
| KR | 20100104908 A | 9/2010 |
| KR | 101028993 B1 | 4/2011 |
| KR | 20110070527 A | 6/2011 |
| KR | 20110119156 A | 11/2011 |

* cited by examiner

3-DIMENSIONAL (3D) NON-VOLATILE MEMORY DEVICE AND METHOD OF FABRICATING THE SAME

CROSS-REFERENCES TO RELATED APPLICATION

This application claims the benefit of Korean Patent Application No. 10-2011-0056207 filed on Jun. 10, 2011, and No. 10-2011-0061665 filed on Jun. 24, 2011 in the Korean Intellectual Property Office, the disclosures of which are incorporated herein in its entirety by references.

BACKGROUND OF THE INVENTION

1. Field of the Invention

The present invention relates to a non-volatile memory device, and more particularly, to a 3-dimensional (3D) non-volatile memory device and a method of fabricating the same.

2. Description of the Related Art

Recently, along with increasing demands for portable application devices, such as digital cameras, MP3 players, personal digital assistants (PDAs), and mobile phones, the non-volatile memory device market is expanding rapidly. As flash memory devices, which are programmable non-volatile memory devices, approach scaling limit, non-volatile memory devices employing reversibly-deformable material films are being focused as replacements of the flash memory device.

Generally, integration of a semiconductor memory device is an important factor for determining price of a product. Therefore, demands for increasing integration of semiconductor memory devices are increasing. Generally, integration of a semiconductor memory device is mainly determined based on a 2-dimensional area occupied by a unit memory cell, thus being significantly affected by the level of fine pattern forming technique. However, as a demanded level of fine pattern forming technique increases, it becomes more difficult to arrange necessary semiconductor fabricating equipments and/or semiconductor fabricating processes. Therefore, integration of a semiconductor memory device is approaching to its limit.

To overcome such limits, a semiconductor memory device having a 3-dimensional (3D) structure has been recently suggested. However, the new structure causes problems including unstable process and deterioration of product reliability. Therefore, researches are being made to resolve the problems.

SUMMARY OF THE INVENTION

The present invention provides a 3-dimensional (3D) non-volatile memory device which has a simple structure and may have high integration in correspondence to continuous demands for high integration.

The present invention also provides a method for easily and reliably fabricating a 3D non-volatile memory device having the above-stated advantages.

According to an aspect of the present invention, there is provided a 3D non-volatile memory device including a plurality of conductive lines, which are separated from one another in parallel; a plurality of conductive planes, which extend across the plurality of conductive lines and are separated from one another in parallel; and non-volatile data storage layer patterns, which are respectively arranged at regions of intersection at which the plurality of conductive lines and the plurality of conductive planes cross each others.

The non-volatile data storage layer pattern may include a phase change material, a variable resistive material, a programmable metallization cell (PMC), a magnetic material, or a combination thereof. The 3D non-volatile memory device may further include selection diode layer patterns, which are connected to the non-volatile data storage layer pattern in series, between the regions of intersection. In this case, the non-volatile data storage layer patterns and the selection diode layer patterns may surround the plurality of conductive lines. Furthermore, the 3D non-volatile memory device may further include insertion electrode layers between the non-volatile data storage layer patterns and the selection diode layer patterns.

According to another aspect of the present invention, there is provided a 3D non-volatile memory device including a plurality of conductive lines, which include linear patterns that extend on a substrate in a first direction parallel to the main surface of the substrate and are 3-dimensionally arranged by being arranged in parallel with one another and separated from one another in a second direction and a third direction different from the first direction; a plurality of conductive planes, which extend on the substrate in the second direction and the third direction, are separated from one another in parallel in the first direction, and cross the plurality of conductive lines; insulation layer patterns, which are arranged between the plurality of conductive planes; and non-volatile data storage layer patterns, which are respectively arranged at regions of intersection at which the plurality of conductive lines and the plurality of conductive planes cross each others.

The non-volatile data storage layer pattern may include a phase change material, a variable resistive material, a programmable metallization cell (PMC), a magnetic material, or a combination thereof. The 3D non-volatile memory device may further include selection diode layer patterns, which are connected to the non-volatile data storage layer pattern in series, between the regions of intersection. The 3D non-volatile memory device may further include supporting structures, which successively penetrate the non-volatile data storage layer patterns and the plurality of conductive lines.

According to another aspect of the present invention, there is provided a method of fabricating a 3D non-volatile memory device, the method including forming a plurality of conductive lines, which are separated from one another in parallel; forming a plurality of non-volatile data storage layer patterns on the plurality of conductive lines; and forming a plurality of conductive planes, which extend across the plurality of conductive lines and are separated from one another in parallel, such that regions of intersection, at which the plurality of conductive lines and the plurality of conductive planes cross each other, are defined on the non-volatile data storage layer patterns.

The forming of the non-volatile data storage layer patterns may include forming non-volatile data storage layers on the plurality of conductive lines; and forming the non-volatile data storage layer patterns by patterning the non-volatile data storage layers at a constant interval.

The non-volatile data storage layer pattern may include a phase change material, a variable resistive material, a programmable metallization cell (PMC), a magnetic material, or a combination thereof. The method may further include forming of selection diode layer patterns, which constitute stacked structures together with the non-volatile data storage layer patterns.

According to another aspect of the present invention, there is provided a method of fabricating a 3D non-volatile memory device, the method including stacking first sacrificing layers and first conductive layers on a substrate alternately and repeatedly; forming a plurality of stack line patterns, which are separated from one another in parallel, by successively line-patterning the first sacrificing layers and the first conductive layers; exposing the conductive line patterns by removing at least portions of the first sacrificing layers remaining in the plurality of stack line patterns; forming non-volatile data storage layers on the exposed conductive line patterns; and forming a plurality of conductive flat-panels, which extend across the conductive line patterns having formed thereon the non-volatile data storage layers and are separated from one another in parallel, on the substrate.

The method may further include, between the forming of the non-volatile data storage layers and the forming of the plurality of conductive planes, forming second sacrificing layers, which covers the conductive lines having formed thereon the non-volatile data storage layers, on the substrate; forming second sacrificing layer patterns, which cross the conductive line patterns, by line-patterning the second sacrificing layers in a second direction, which is different from the first direction and exposing first portions of the conductive line patterns having formed thereon the non-volatile data storage layers between the second sacrificing layer patterns; forming insulation layer patterns between the second sacrificing layer patterns to cover the first portions of the conductive line patterns exposed between the second sacrificing layer patterns; and exposing second portions of the conductive line patterns having formed thereon the non-volatile data storage layers between the insulation layer patterns by removing the second sacrificing layer patterns. In this case, the conductive planes may be formed between the insulation layer patterns to cover the second portions of the conductive line patterns having formed thereon the non-volatile data storage layers The method may further include forming diode layers on or below the non-volatile data storage layers. The method may further include forming diode layer patterns by removing the diode layers exposed between the second sacrificing layer patterns, after the forming of the diode layers on or below the non-volatile data storage layers, between the forming of the first portions of the conductive line patterns and the forming of the insulation layer patterns. In this case, the method may further include successively removing the non-volatile data storage layers together with the diode layers exposed between the second sacrificing layer patterns.

The method may further include forming a plurality of penetration holes, which penetrate the first sacrificing layers and the first conductive layers that are alternately and repeatedly stacked; and forming supporting structures, which fill the plurality of penetration holes.

According to another aspect of the present invention, there is provided a non-volatile memory device including wiring stacks, which include a plurality of conductive lines stacked on a substrate in a vertical direction and are separated from one another; data storage layers, which are formed on sidewalls of the wiring stacks and are electrically connected to the plurality of conductive lines; channel layers, which interpose the data storage layers with the plurality of conductive lines therebetween and extend across the plurality of conductive lines, wherein memory cells including at least portions of the data storage layers are defined at regions at which the channel layers and the plurality of conductive lines cross each others; gate insulation layers, which contact the channel layers, respectively; and control gate structures, which are formed on the gate insulation layers and control electric connections between the non-volatile memory cells and the respective channel layers by controlling electric conductivities of the respective channel layers.

The data storage layers may include first and second data storage layers, which are arranged on sidewalls of the wiring stacks adjacent to one another and face each other. In this case, the channel layers may include first and second channel layers, which interpose the plurality of conductive lines of the wiring stacks adjacent to one another and the first and second data storage layers, extend across the plurality of conductive lines, and define memory cells including at least portions of the data storage layers at regions at which the first and second channel layers and the plurality of conductive lines cross each others, and the control gate structure may be a common control gate structure, which is arranged to contact both the first and second channel layers.

The non-volatile data storage layer pattern may include a phase change material, a variable resistive material, a programmable metallization cell (PMC), a magnetic material, or a combination thereof. The plurality of conductive lines may function as one from between word lines and bit lines, and the channel layers may function as the other one from between word lines and bit lines.

The wiring stacks may further include interlayer insulation layer patterns for electrically separating the plurality of conductive lines from one another, and the plurality of conductive lines may be recessed from side surfaces of the interlayer insulation layer patterns.

According to another aspect of the present invention, there is provided a method of fabricating a non-volatile memory device, the method including stacking first insulation layers and first conductive layers on a substrate alternately and repeatedly; forming wiring stacks separated from one another, the wiring stacks including a plurality of conductive lines and interlayer insulation layer patterns between the plurality of conductive lines, by successively line-patterning the first insulation layers and the first conductive layers; forming data storage layers on surfaces of the wiring stacks including sidewalls facing each others; forming channel layers, which interpose the data storage layers with the plurality of conductive lines, extend across the plurality of conductive lines, and define memory cells including at least portions of the data storage layers at regions at which the channel layers and the plurality of conductive lines cross each others; forming gate insulation layers, which contact the channel layers, respectively; and forming control gate structures, which are formed on the gate insulation layers and control electric connections between the non-volatile memory cells and the respective channel layers by controlling electric conductivities of the respective channel layers.

The forming of the data storage layers may include conformally forming data storage material layers on the wiring stacks; forming second insulation layers, which fill trenches between the wiring stacks; and planarizing the second insulation layers until surfaces of the wiring stacks are exposed.

Furthermore, the forming of the channel layers may include forming first penetration holes, which contact the data storage layers and penetrate the second insulation layers in a vertical direction; and filling the first penetration holes with a semiconductor material. In this case, the forming of the control gate structures may includes forming penetration holes, which contact the channel layers and penetrate the second insulation layers in a vertical direction; forming the gate insulation layers in the second penetration holes to contact the channel layers; and forming the gate electrodes in the second penetration holes to contact the gate insulation layers.

Alternatively, the forming of the control gate structures may include forming penetration holes, which contact the channel layers and penetrate the second insulation layers in a vertical direction; and forming the gate insulation layers and the gate electrodes surrounded by the gate insulation layers in the second penetration holes. In this case, the forming of the channel layers includes forming first penetration holes, which penetrate the second insulation layers in a vertical direction to contact the data storage layers and the gate insulation layers; and filling the first penetration holes with a semiconductor material.

BRIEF DESCRIPTION OF THE DRAWINGS

The above and other features and advantages of the present invention will become more apparent by describing in detail exemplary embodiments thereof with reference to the attached drawings in which:

FIGS. 10A through 10L are perspective diagrams showing a method of fabricating a non-volatile memory device according to an embodiment of the present invention in an order;

DETAILED DESCRIPTION OF THE INVENTION

Figure 1A:
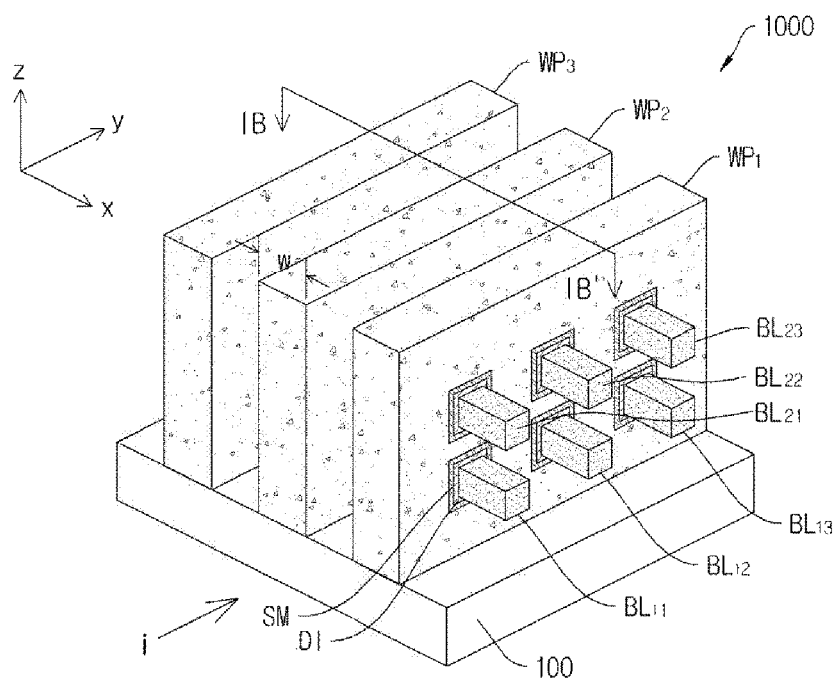
FIG. 1A is a schematic perspective view of a cell array of a 3-dimensional (3D) non-volatile memory device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a form shape "adjacent to" other shape may overlap the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

Figure 1B:
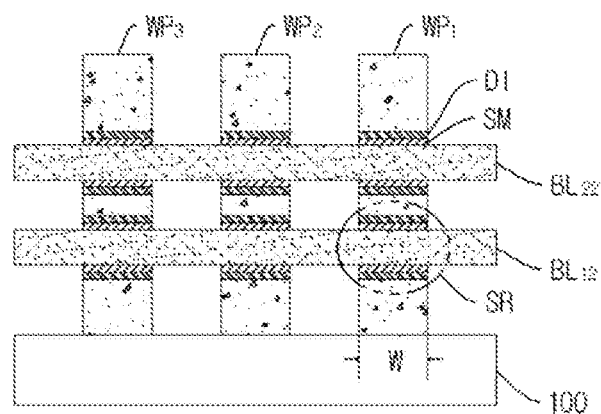
FIG. 1B is a sectional view obtained along a line IB-IB' of FIG. 1A.
Figure 1C:
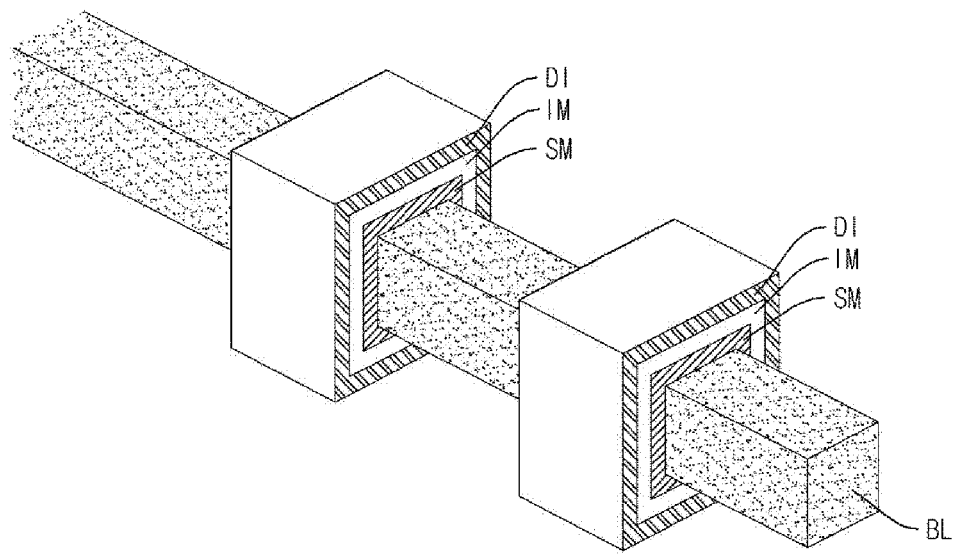
FIG. 1C is a schematic diagram showing a 3D non-volatile memory device according to another embodiment of the present invention.

FIG. 1A is a schematic perspective view of a cell array of a 3-dimensional (3D) non-volatile memory device according to an embodiment of the present invention. FIG. 1B is a sectional view obtained along a line IB-IB' of FIG. 1A. FIG. 1C is a schematic diagram showing a 3D non-volatile memory device according to another embodiment of the present invention.

Referring to FIGS. 1A and 1B, a cell array 1000 includes a plurality of conductive lines BL11, BL12, and BL13; BL21, BL22, and BL23 that are separated from one another in parallel. The plurality of conductive lines BL11, BL12, and BL13; BL21, BL22, and BL23 may be conductive patterns extending in a first direction (e.g., the x-axis direction) that is parallel to the main surface of a substrate 100, as shown in FIG. 1A. The plurality of conductive lines BL11, BL12, and BL13; BL21, BL22, and BL23 may be 3-dimensionally arranged by being arranged separated from one another in parallel in a second direction (e.g., the y-axis direction) and a third direction (e.g., the z-axis direction), which differ from the x-axis direction.

Although the plurality of conductive lines BL11, BL12, and BL13; BL21, BL22, and BL23 are repeatedly arranged for three times in the y-axis direction, the arrangement is merely an example, and the plurality of conductive lines BL11, BL12, and BL13; BL21, BL22, and BL23 may be repeatedly arranged for twice, four times, or a larger number of times based on a capacity of a non-volatile memory device. Furthermore, the plurality of conductive lines BL11, BL12, and BL13; BL21, BL22, and BL23 are repeatedly arranged for twice in the z-axis direction, the arrangement is merely an example, and the plurality of conductive lines BL11, BL12, and BL13; BL21, BL22, and BL23 may be repeatedly arranged for twice, four times, or a larger number of times, as described above.

Cross-sectional shape of the plurality of conductive lines BL11, BL12, and BL13; BL21, BL22, and BL23 in the widthwise direction may be rectangular as shown in FIG. 1A. However, the present invention is not limited thereto, and the cross-sectional shape of the plurality of conductive lines BL11, BL12, and BL13; BL21, BL22, and BL23 in the widthwise direction may also be circular or elliptical. Furthermore, although the plurality of conductive lines BL11, BL12, and BL13; BL21, BL22, and BL23 have a solid form in the embodiment shown in FIG. 1a, the plurality of conductive lines BL11, BL12, and BL13; BL21, BL22, and BL23 may also have a hollow pipe-like form. Furthermore, surfaces of the plurality of conductive lines BL11, BL12, and BL13; BL21, BL22, and BL23 may have a 3-dimensional pattern including grooves or protrusions to define programmable regions of non-volatile data storage layers described below.

The cell array 1000 includes a plurality of conductive planes WP1, WP2, and WP3 which extend across the plurality of conductive lines BL11, BL12, and BL13; BL21, BL22, and BL23 and are separated from one another in parallel. The plurality of conductive planes WP1, WP2, and WP3 may be flat-panel patterns having a predetermined width w. The plurality of conductive planes WP1, WP2, and WP3 may extend in the second direction (the y-axis direction) and the third direction (the z-axis direction), which differ from the first direction (the x-axis direction).

The plurality of conductive lines BL11, BL12, and BL13; BL21, BL22, and BL23 and the plurality of conductive planes WP1, WP2, and WP3 define points of intersection that are 3-dimensionally arranged in the x-axis direction, the y-axis direction, and the z-axis direction. Since the plurality of conductive planes WP1, WP2, and WP3 have the width w, the points of intersection will be regions of intersection having the width w. Non-volatile data storage layer patterns SM for storing bit values may be disposed between the regions of intersection. Each of the non-volatile data storage layer patterns SM arranged at the respective points of intersection may define a unit memory cell.

As shown in FIG. 1B, the non-volatile data storage layer patterns SM may be locally disposed in the regions of intersection (indicated as SR with a dotted line) having the width w. However, it is merely an example. According to another embodiment of the present invention, the non-volatile data storage layer patterns SM may extend from the regions of intersection SR and disposed on the plurality of conductive lines BL11, BL12, and BL13; BL21, BL22, and BL23 between the plurality of conductive planes WP1, WP2, and WP3.

Electric resistance of the non-volatile data storage layer pattern SM may be reversibly changed by an electric signal, and, for embodying a non-volatile memory operation, may contain a phase change material, a variable resistive material, a programmable metallization cell (PMC), a magnetic material, or a combination thereof, which may maintain the electric resistance even if no energy is applied from outside.

The phase change material is a material which may be reversibly changed from amorphous state to crystalline state or vice versa, where electric resistances in each of the above-stated states are different from each other. Generally, the phase change material exhibits a relatively high resistance in amorphous state and a relatively low resistance in crystalline state. The phase change material may contain a GeSbTe-based material, that is, a Calcogenide based compound, such as $GeSb_2Te_3$, $Ge_2Sb_2Te_5$, $GeSb_2Te_4$, or a combination thereof. Phase change materials other than the above-state materials include GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, $GeTeSb_2$, $GeTe_3Sb$, GeSbTePd, and AgInSbTe. However, the above-stated materials are merely examples, and the present invention is not limited thereto. Furthermore, a material formed by implanting non-metal atoms, such as B, C, N, and P, to any of the above-stated materials may also be used.

Phase change required in embodiments of the present invention is not limited to transition between completely crystalline state and completely amorphous state and also includes a change between two states that are sufficiently different from each other for detecting a difference within the overall spectrum between the completely crystalline state and the completely amorphous state. Furthermore, the phase change may occur throughout a non-volatile data storage layer pattern or at a portion of the non-volatile data storage layer pattern. As stated above, since phase change may occur at portions of non-volatile data storage layer patterns SM, it is not necessary for the non-volatile data storage layer patterns SM to locally exist in the regions of intersection SR, as described above.

According to another embodiment of the present invention, the non-volatile data storage layer pattern SM may contain the variable resistive material, which may be changed between a low resistance state and a high resistance state by electric signals, like the phase change material. Examples of the variable resistive materials include Perovskite oxides, such as $SrTiO_3$, $SrZrO_3$, and $Nb:SrTiO_3$, or transition metal oxides, such as $TiO_x$, NiO, $TaO_x$, $HfO_x$, $AlO_x$, $ZrO_x$, $CuO_x$, $NbO_x$, $TaO_x$, $GaO_x$, $GdO_x$, $MnO_x$, PrCaMnO, and $ZnONiO_x$.

The Perovskite oxides and the transition metal oxides exhibit characteristics of switching resistance based on electric pulses. To describe the switching characteristics, various mechanisms related to conductive pillars, interface effects, and trapped charges are suggested. However, none of the mechanisms is sufficiently clear. However, the materials commonly have factors having a kind of hysteresis inflicting electron-based effects to currents in fine structures suitable for non-volatile memory device applications, and thus the materials may be applied to the non-volatile data storage layer pattern SM.

The hysteresis may be categorized based on unipolar resistive materials, which are not affected by polarity of an applied voltage, and bipolar resistive materials. However, the present invention is not limited thereto. For example, the non-volatile data storage layer pattern SM may be formed of a unipolar resistive material only or a bipolar resistive material only. Alternatively, the non-volatile data storage layer pattern SM may be designed for multi-bit operation by including a stacked structure in which a layer formed of the unipolar resistive material and a layer formed of the bipolar resistive material are stacked.

According to another embodiment of the present invention, the non-volatile data storage layer pattern SM may include PMCs. The PMC material may include two metal electrodes, which includes a metal oxide formed of an electrochemically active (e.g., oxidizable) metal, such as silver (Ag), terrarium (Te), copper (Cu), tantalum (Ta), and titanium (Ti), and a metal oxide formed of an electrochemically inactive metal, such as tungsten (W), gold (Au), platinum (Pt), palladium (Pd), and rhodium (Rh), and an electrolyte material, which is arranged between the two metal electrodes and includes super ion regions. At least one from the electrodes may be embodied by using conductive lines or conductive planes.

The PMC material exhibits resistance change or switching characteristics due to physical rearrangement of the super ion regions in the electrolyte material. The electrolyte material including super ion regions may be a base glass material, such as germanium-selenium (GeSe) compound, for example. The GeSe compound may also be referred to as a Calcogenide glass or Calcogenide material. Examples of the GeSe materials include $Ge_3Se_7$, $Ge_4Se_6$ and $Ge_2Se_3$. However, other materials may be used in other embodiments of the present invention.

According to another embodiment of the present invention, the non-volatile data storage layer pattern SM may contain a magnetic material. The magnetic material may be a compound including a combination of Mg, Ni, CO, and/or Fe, for example. In this case, the non-volatile data storage layer patterns SM may be applied as a giant magneto resistive (GMR) device and a tunneling magneto resistive (TMR) device. Particularly, in case of the TMR device, the non-volatile data storage layer pattern SM may include a magnetic tunneling junction that is obtained from a stacked structure in which a layer formed of any of the magnetic material and an appropriate insulation layer are stacked and may embody a spin torque transmitting memory.

The above-stated materials regarding the non-volatile data storage layer pattern SM are merely examples, and the present invention is not limited thereto. Furthermore, as described above, the non-volatile data storage layer pattern SM may include a single layer or a stacked structure in which two or more from among the combinations of the above-stated layers are stated.

While a memory cell formed by the non-volatile data storage layer patterns SM arranged between the regions of intersection SR is being read or programmed, to eliminate signal interference occurring at other memory cells that are not selected, the cell array 1000 may further include selection diode layer patterns DI. The selection diode layer patterns DI may be respectively connected to the non-volatile data storage layer patterns SM in series. Regarding a sequence of stacking the non-volatile data storage layer patterns SM and the selection diode layer patterns DI, as shown in FIG. 1A, the selection diode layer patterns DI may be stacked on the non-volatile data storage layer patterns SM. However, the present invention is not limited thereto. According to another embodiment of the present invention, the non-volatile data storage layer patterns SM may be stacked on the selection diode layer patterns DI.

The selection diode layer patterns DI are electric elements having rectification characteristics and may be P-N junction diodes or Schottky junction diodes. The P-N junction diode may be formed by making P-type semiconductor layer surrounding a non-volatile data storage layer patterns SM on the non-volatile data storage layer pattern SM, stacking an N-type semiconductor layer on a P-type semiconductor layer and performing an appropriate patterning operation thereto. Alternatively, the P-N junction diode may be formed by forming an N-type semiconductor layer surrounding a non-volatile data storage layer pattern SM on the non-volatile data storage layer pattern SM, stacking a P-type semiconductor layer on the N-type semiconductor layer, and performing an appropriate patterning operation thereto. The Schottky junction diodes may be formed by stacking a semiconductor layers that form Schottky junction and conductive layers that ohmic-contact the semiconductor layer on the non-volatile data storage layer pattern SM forwardly or reversely and appropriately patterning the layers.

In the above-stated embodiments, the non-volatile data storage layer patterns SM and the selection diode layer patterns DI surround the plurality of conductive lines BL11, BL12, and BL13; BL21, BL22, and BL23 in the regions of intersection SR. However, it is merely an example, and the present invention is not limited thereto. For example, either the non-volatile data storage layer patterns SM and the selection diode layer patterns DI may surround the plurality of conductive lines BL11, BL12, and BL13; BL21, BL22, and BL23. Alternatively, neither the non-volatile data storage layer patterns SM nor the selection diode layer patterns DI may surround the plurality of conductive lines BL11, BL12, and BL13; BL21, BL22, and BL23.

According to another embodiment of the present invention, as shown in FIG. 1C, insertion electrode layers IM may be further arrange between the non-volatile data storage layer patterns SM and the selection diode layer patterns DI formed on a conductive line BL. The insertion electrode layers IM may function as barrier layers for suppressing undesired side effects between the non-volatile data storage layer patterns SM and the selection diode layer patterns DI.

Referring back to FIGS. 1A and 1B, to fabricate a 3D non-volatile memory device, the plurality of conductive lines BL11, BL12, and BL13; BL21, BL22, and BL23 may be formed to be separated from one another in parallel. Next, memory cell separation may be performed by patterning non-volatile data storage layer patterns and selection diode layer patterns at equal intervals around the plurality of conductive lines BL11, BL12, and BL13; BL21, BL22, and BL23. As described above, the non-volatile data storage layer pattern may include a single layer or a stacked structure in which a plurality of layers are stacked. In case of forming the non-volatile data storage layer pattern by stacking a unipolar resistive material and a bipolar resistive material, the selection diode layer patterns may be omitted.

Via the memory cell separation, non-volatile data storage layer patterns SM and/or selection diode layer patterns DI may be formed. The non-volatile data storage layer patterns SM and the selection diode layer patterns DI form memory cells. Next, the plurality of conductive planes WP1, WP2, and WP3, which extend across the plurality of conductive lines BL11, BL12, and BL13; BL21, BL22, and BL23 and are separated from one another in parallel, may be formed on the memory cells. According to embodiments of the present invention, insertion electrode layers may be further formed between non-volatile data storage layers and selection diode layers, thereby providing the insertion electrode layer patterns IM between the non-volatile data storage layer patterns SM and the selection diode layer patterns DI.

Figure 2:
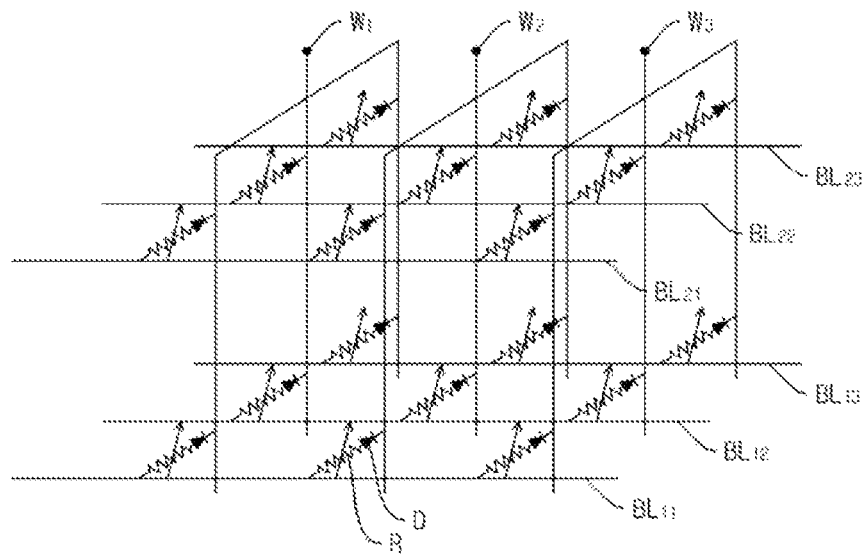
FIG. 2 is a circuit diagram of a non-volatile memory device according to an embodiment of the present invention.

FIG. 2 is a circuit diagram of a non-volatile memory device according to an embodiment of the present invention.

Referring to FIG. 2, the non-volatile memory device may include first signal lines BL1, BL12, and BL13; BL21, BL22, and BL23, second signal lines W1, W2, and W3, and variable resistors R and diodes that are connected in series. The variable resistors R and the diodes D may be electrically connected between the first signal lines BL1, BL12, and BL13; BL21, BL22, and BL23 and the second signal lines W1, W2, and W3. The variable resistors R function as memory cells, and the diodes D may suppress interferences between memory cells adjacent to one another.

To access the variable resistors R connected between the first signal lines BL1, BL12, and BL13; BL21, BL22, and BL23 and the second signal lines W1, W2, and W3, the first signal lines BL1, BL12, and BL13; BL21, BL22, and BL23 and the second signal lines W1, W2, and W3 may be independently selected. To select the signal lines, select transistors (not shown) may be connected to ends of at least one type of the signal lines.

Referring to FIGS. 2 and 1A, the first signal lines BL1, BL12, and BL13; BL21, BL22, and BL23 may correspond to the plurality of conductive lines BL11, BL12, and BL13; BL21, BL22, and BL23 of FIG. 1A, respectively. In other words, the first signal lines BL1, BL12, and BL13; BL21, BL22, and BL23 may have a 1-dimensional linear shape. The second signal lines W1, W2, and W3 may correspond to the plurality of conductive planes WP1, WP2, and WP3 of FIG. 1A, respectively. In other words, the second signal lines W1, W2, and W3 may have a 2-dimensional flan panel-like shape.

Furthermore, the variable resistors R may correspond to the non-volatile data storage layer patterns SM of FIG. 1A, whereas the diodes D may correspond to the selection diode layer patterns DI of FIG. 1A. According to another embodiment of the present invention, as described above with reference to FIG. 1A, the selection diode layer patterns DI may be omitted by forming the non-volatile data storage layer patterns SM to have stacked structures in which a unipolar resistive material layer and a bipolar resistive material layer are stacked. In this case, the diodes D may be omitted.

The first signal lines BL1, BL12, and BL13; BL21, BL22, and BL23 may be bit lines and the second signal lines W1, W2, and W3 may be word lines (more particularly, word planes) or vice versa. The signal lines may be electrically connected to a driver circuit (not shown) formed on the substrate 100. Furthermore, the numbers of memory cells that are arranged in the x-axis direction, the y-axis direction, and the z-axis direction to form a 3D arrangement may be 2m (m is a natural number) in each of the directions, and the 3D arrangement may be designed based on appropriate blocks and page unit for high-speed byte-addressing.

FIGS. 3A through 3K are perspective diagrams showing a method of fabricating a 3D non-volatile memory device according to an embodiment of the present invention in an order. FIG. 4 is a sectional view obtained along a line IV-IV' of FIG. 3K.

Figure 3A:
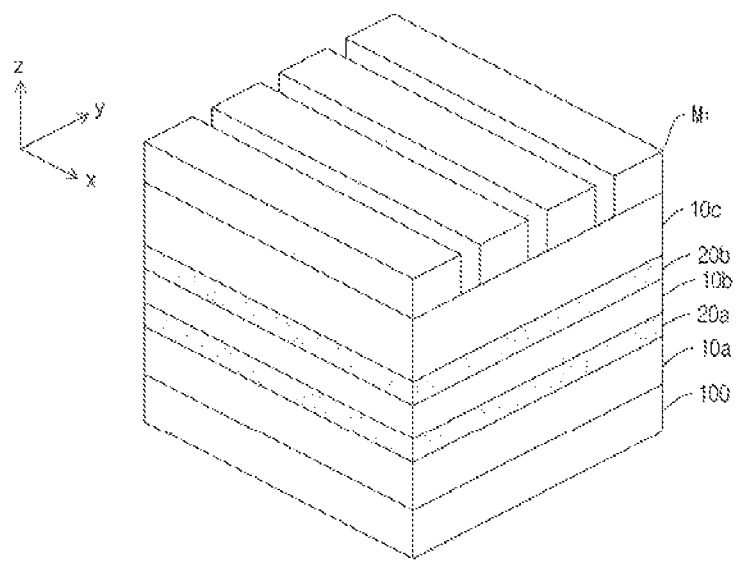
FIGS. 3A through 3K are perspective diagrams showing a method of fabricating a 3D non-volatile memory device according to an embodiment of the present invention in an order.
Figure 4:
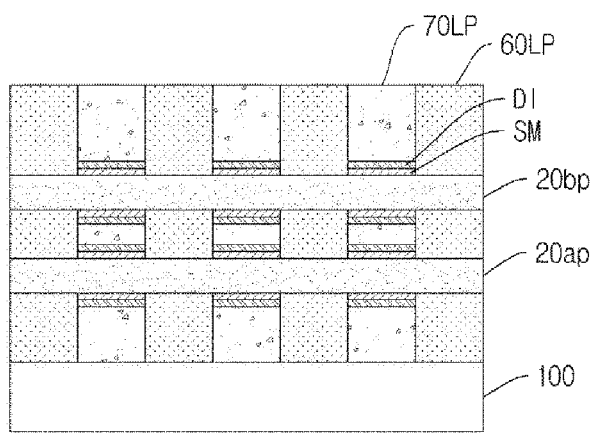
FIG. 4 is a sectional view obtained along a line IV-IV' of FIG. 3K.

Referring to FIG. 3A, first sacrifice layers 10a, 10b, and 10c and first conductive layers 20a and 20b may be alternately and repeatedly stacked on a substrate 100. The substrate 100 may include a silicon-based base structure, such as silicon, silicon-on-insulator (SOI), silicon-germanium, or silicon-on-sapphire (SOS), or a group III-V semiconductor material, such as germanium and gallium-arsenide-based compound materials. Alternatively, the substrate 100 may include any of various materials other than the semiconductor materials stated above. The materials stated above are mere examples, and the present invention is not limited thereto.

Thicknesses of the first sacrifice layers 10a, 10b, and 10c stacked on the substrate 100 may be appropriately selected. For example, from among the first sacrifice layers 10a, 10b, and 10c, the first sacrifice layers 10b interposed between the conductive layers 20a and 20b may be constant, whereas thicknesses of the other sacrifice layers 10a and 10c may differ therefrom. The first sacrifice layers 10a, 10b, and 10c may be insulation layers, e.g., silicon oxide, silicon nitride, and/or silicon oxynitride, or a combination thereof. The first sacrifice layers 10a, 10b, and 10c may be formed via plasma enhanced chemical vapor deposition or chemical vapor deposition, for example. However, the present invention is not limited thereto.

The first conductive layers 20a and 20b may have a same thickness. The first conductive layers 20a and 20b may be formed via a physical vapor deposition, such as sputtering, or a chemical vapor deposition. The first conductive layers 20a and 20b becomes conductive lines (BL11, BL12, and BL13; BL21, BL22, and BL23 of FIG. 1A) via a patterning process described below, and may contain a highly-conductive metal, such as platinum (Pt), ruthenium (Ru), iridium (Ir), silver (Ag), aluminum (Al), titanium (Ti), tantalum (Ta), tungsten (W), silicon (Si), copper (Cu), nickel (Ni), cobalt (Co), molybdenum (Mo), or an alloy thereof. Alternatively, the first conductive layers 20a and 20b may include a conductive nitride of any of the above-stated metal (e.g., TiN, MoN, etc.), a conductive oxynitride of any of the above-stated metal (e.g., TiON) or a combination thereof (e.g., TiSiN, TiAlON, etc.). However, the above-stated materials are merely examples, and the present invention is not limited thereto. The first conductive layers 20a and 20b may include any of various other materials as long as a reliable interface between the conductive layers 20a and 20b and the non-volatile data storage layer patterns SM may be formed.

On the structure in which the first sacrifice layers 10a, 10b, and 10c and the first conductive layers 20a and 20b are alternately and repeated stacked, a first etching mask M1 having a linear pattern may be provided. The linear pattern of the first etching mask M1 may extend in the first direction (e.g., the x-axis direction) that is parallel to the substrate 100.

Figure 3B:
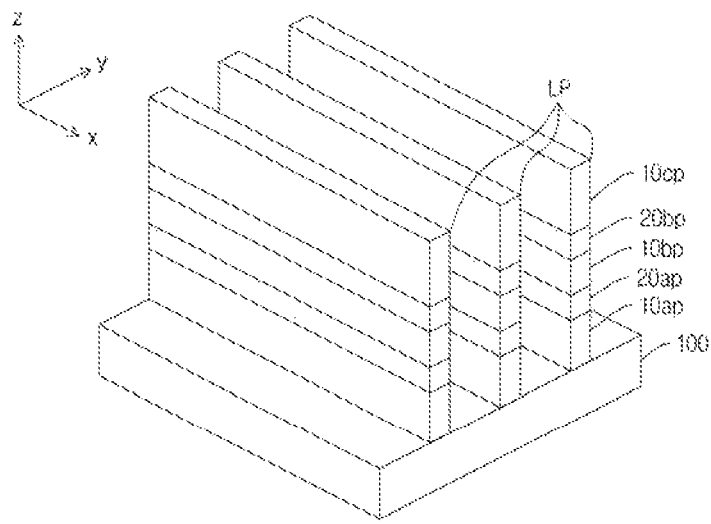

Referring to FIG. 3B, a plurality of stacked linear patterns LP which extend in the x-axis direction and are separated from one another in parallel in a second direction (e.g., the y-axis direction) that is different from the x-axis direction, are formed by successively patterning the first sacrifice layers 10a, 10b, and 10c and the conductive layers 20a and 20b by using the first etching mask M1 as an etching mask. The patterning operation may be performed via a dry etching operation, such as reactive ion etching. In the stacked linear patterns LP, first sacrifice layer patterns 10ap, 10bp, and 10cp originated from the first sacrifice layers 10a, 10b, and 10c and conductive line patterns 20ap and 20bp originated from the conductive layers 20a and 20b may be repeatedly stacked.

Figure 3C:
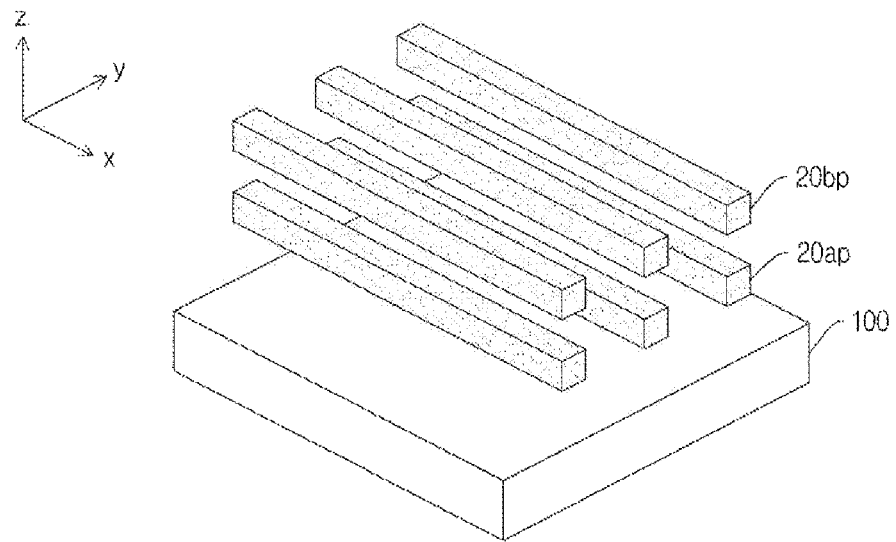

Referring to FIG. 3C, the conductive line patterns 20ap and 20bp are completely exposed by removing portions of the first conductive layers 20a and 20b remaining in the stacked linear patterns LP, that is, the first sacrifice layer patterns 10ap, 10bp, and 10cp. The removing operation may be performed via an isotropic etching operation, such as a wet etching. According to embodiments of the present invention, a supporting structure for supporting the conductive line patterns 20ap and 20bp that are separated from one another may be provided before the removing operation. Detailed descriptions thereof will be given later.

Figure 3D:
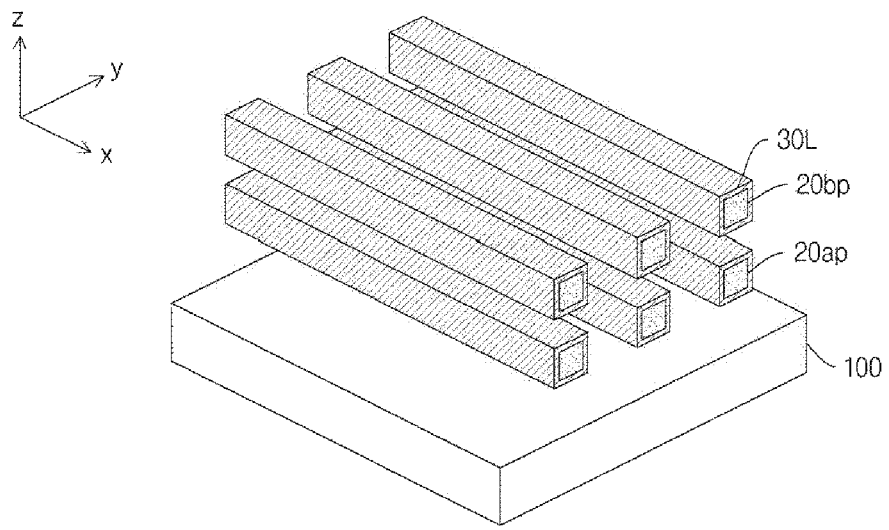
Figure 3E:
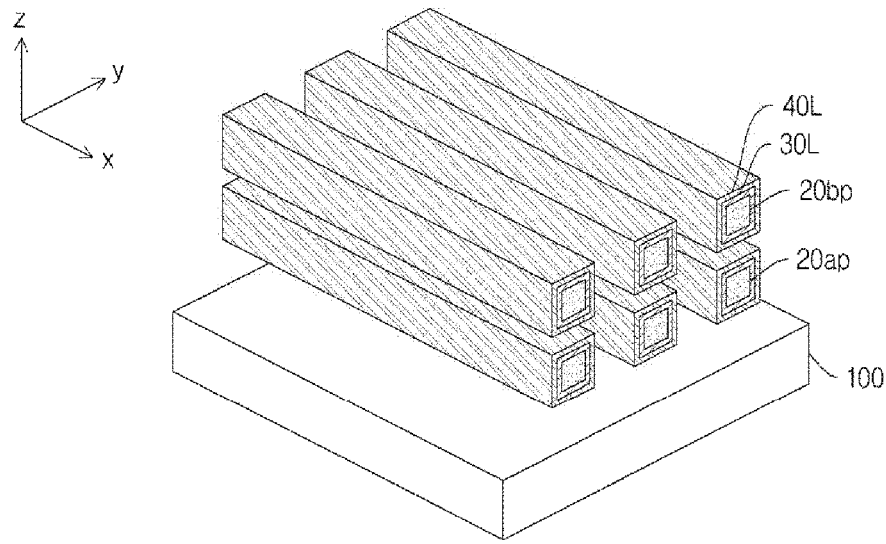

Referring to FIG. 3D, non-volatile data storage layers 30L are formed on the exposed conductive line patterns 20ap and 20bp. The non-volatile data storage layers 30L may be formed of a variable resistive material or a variable magnetic material, as described above with reference to FIG. 1A. Next, as shown in FIG. 3E, diode layers 40L may be formed on the non-volatile data storage layers 30L. The diode layers 40L may be P-N junction diodes or Schottky diodes, as described above with reference to FIG. 1A.

According to another embodiment of the present invention, the diode layers 40L may be formed on the exposed conductive line patterns 20ap and 20bp, and then the non-volatile data storage layers 30L may be formed on the diode layers 40L. According to another embodiment of the present invention, insertion electrode layers (IM of FIG. 1C) may be further formed between the non-volatile data storage layers 30L and the diode layers 40L. The non-volatile data storage layers 30L, the diode layers 40L, and the insertion electrode layers IM may be formed via a chemical vapor deposition or an atomic layer deposition for uniform deposition. According to another embodiment of the present invention, the diode layers 40L may be omitted as described above. Furthermore, barrier layers (not shown) for preventing undesired reactions between layers next to one another before the above-stated layers are stacked or after the above-stated layers are stacked Referring to FIG. 3F, second sacrifice layers 50L may be formed on the substrate 100 to cover the conductive line patterns 20*ap* and 20*bp* on which the non-volatile data storage layers 30L and the diode layers 40L are formed. The second sacrifice layers 50L may be formed of silicon oxide, silicon nitride, and/or silicon oxynitride, or a combination thereof, for example. The second sacrifice layers 50L may be formed via a plasma enhanced chemical vapor deposition or a chemical vapor deposition, for example. The second sacrifice layers 50L may be insulation layers having etching selectivity with respect to insulation layer patterns (60LP of FIG. 2I) described below. Next, a second etching mask layer M2 having a linear pattern may be provided on the second sacrifice layers 50L. The second etching mask layer M2 may extend in a second direction (e.g., the y-axis direction) that is different from the x-axis direction.

Figure 3F:
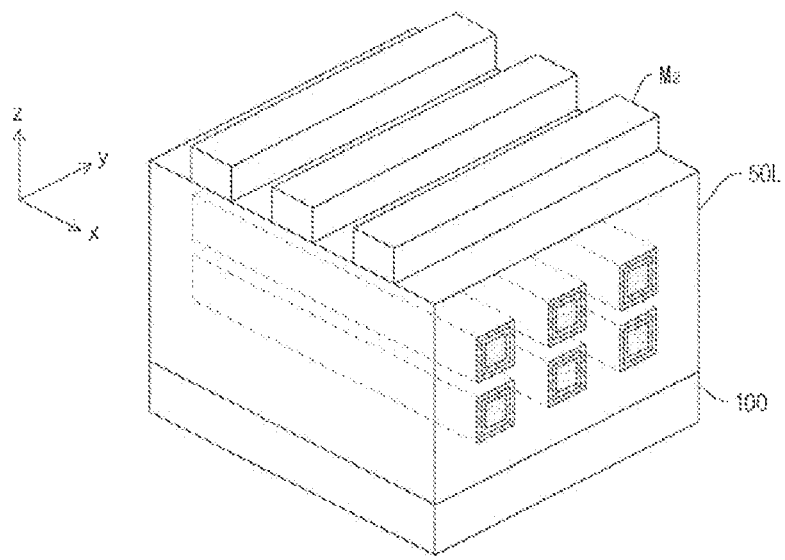
Figure 3G:
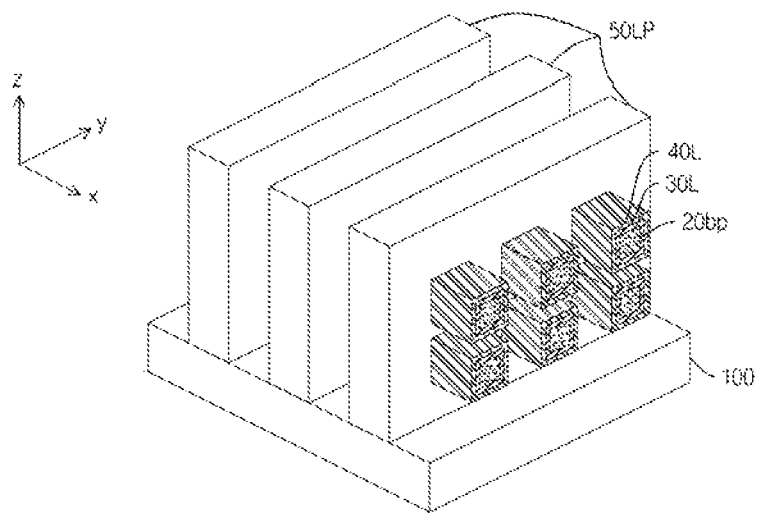

Referring to FIG. 3G, second sacrifice layer patterns 50LP, which cross the conductive line patterns 20*ap* and 20*bp* having stacked thereon the non-volatile data storage layers 30L and the diode layers 40L, may be formed by patterning the second sacrifice layers 50L by using the second etching mask layer M2 as an etching mask. The second sacrifice layer patterns 50LP may extend in the y-axis direction and may be separated from one another in parallel along the x-axis direction. Therefore, first portions of the conductive line patterns 20*ap* and 20*bp* having formed thereon the non-volatile data storage layers 30L and the diode layers 40L may be exposed between the second sacrifice layer patterns 50LP.

Figure 3H:
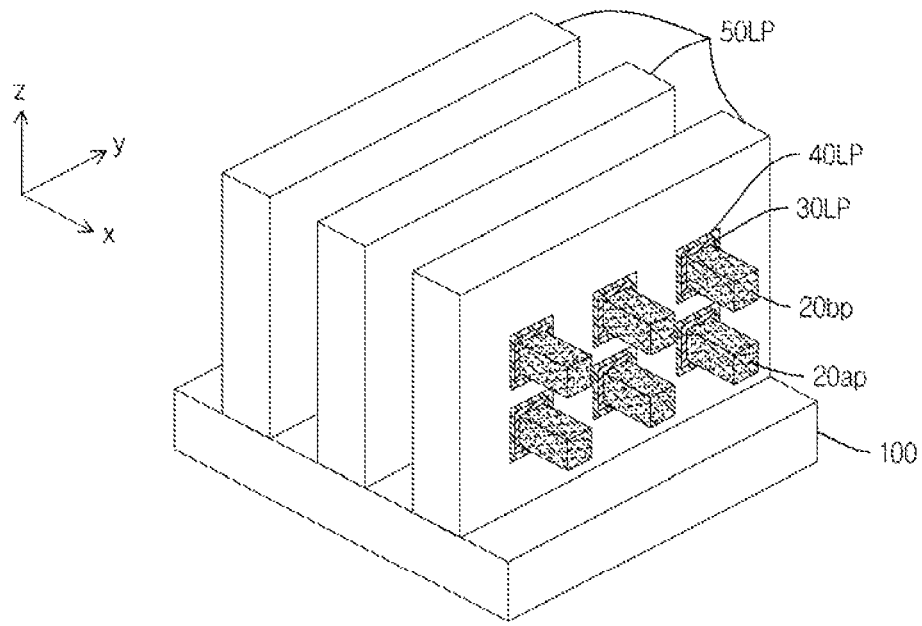

Referring to FIG. 3H, surfaces of the conductive line patterns 20*ap* and 20*bp* are exposed by etching the non-volatile data storage layers 30L and the diode layers 40L on the first portions of the conductive line patterns 20*ap* and 20*bp* exposed between the second sacrifice layer patterns 50LP by using the second sacrifice layer patterns 50LP as an etching mask. Therefore, non-volatile data storage layer patterns 30LP and selection diode layer patterns 40LP may be formed in the second sacrifice layer patterns 50LP. The non-volatile data storage layer patterns 30LP and the selection diode layer patterns 40LP may be separated from each others at a constant interval, thereby embodying cell separation between memory cells adjacent to one another.

According to another embodiment of the present invention, for the cell separation, only the diode layers 40L which may interrupt electric separation between memory cells may be removed, whereas the non-volatile data storage layers 30L may remain. To this end, it is necessary for the non-volatile data storage layers 30L to be non-conductive except at the regions of intersection SR.

Although the above-stated embodiment relates to formation of the diode layers 40L and patterning the non-volatile data storage layers 30L for cell separation, the present invention is not limited thereto. For example, in an embodiment in which the diode layers 40L are not formed and non-volatile data storage layers are formed of unipolar resistive material layers and bipolar resistive material layers, interferences between memory cells may be eliminated by controlling polarity of a driving voltage. In this case, formation of the diode layers 40L may be omitted, and thus it may not be necessary to pattern non-volatile data storage layers for cell separation. In this case, the formation of the second sacrifice layers 50L described above with reference to FIG. 3F and formation of the second sacrifice layer patterns 50LP described above with reference to FIGS. 3G and 3H may be omitted.

Figure 3I:
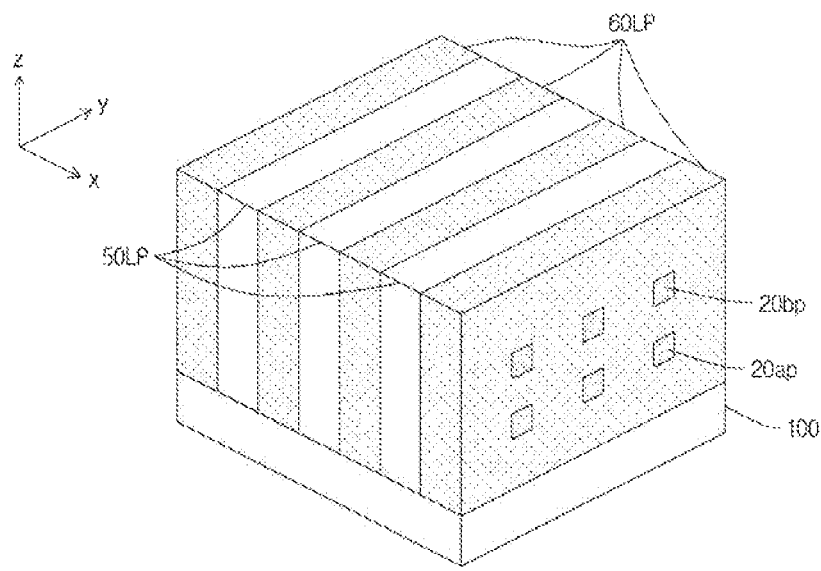

Referring to FIG. 3I, insulation layer patterns 60LP are formed between the second sacrifice layer patterns 50LP to cover portions of the conductive line patterns 20*ap* and 20*bp* exposed between the second sacrifice layer patterns 50LP. The insulation layer patterns 60LP may be formed by forming suitable insulation layers on the second sacrifice layer patterns 50LP to cover the gaps between the second sacrifice layer patterns 50LP and performing a planarizing operation, such as an etch back operation or a chemical-mechanical polishing operation.

Figure 3J:
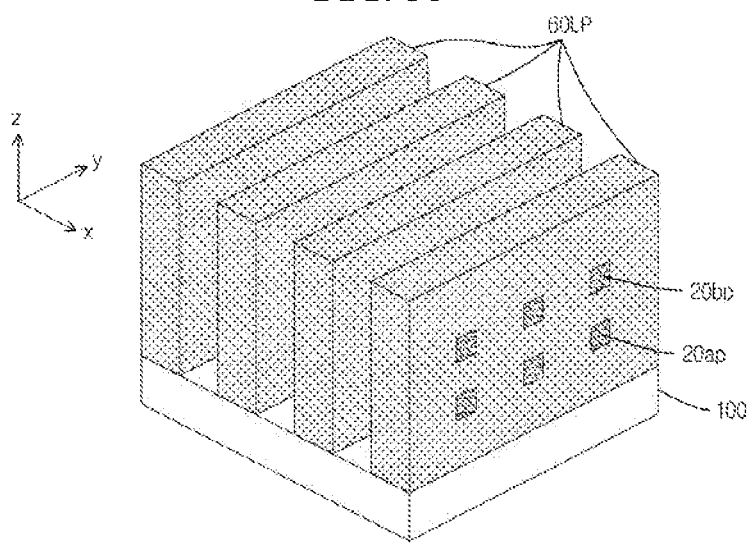

Referring to FIG. 3J, second portions of the conductive line patterns 20*ap* and 20*bp* having formed thereon the non-volatile data storage layer patterns 30LP and the selection diode layer patterns 40LP are exposed between the insulation layer patterns 60LP by removing the second sacrifice layer patterns 50LP.

Figure 3K:
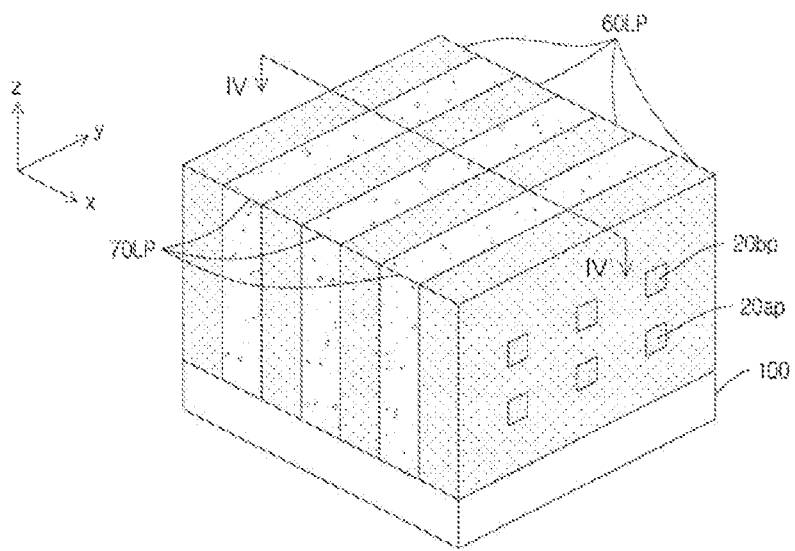

Referring to FIG. 3K, conductive planes 70LP are formed between the insulation layer patterns 60LP to cover the exposed second portions of the conductive line patterns 20*ap* and 20*bp* having formed thereon the non-volatile data storage layer patterns 30LP and the selection diode layer patterns 40LP. The conductive planes 70LP may be formed by forming suitable conductive layers on the insulation layer patterns 60LP to cover the gaps between the insulation layer patterns 60LP and performing a planarizing operation, such as an etch back operation or a chemical-mechanical polishing operation. Therefore, electric connections may be established between the conductive planes 70LP and the non-volatile data storage layer patterns 30LP or the selection diode layer patterns 40LP connected thereto in series.

The conductive layers may contain a highly-stable and highly-conductive metal, such as platinum (Pt), ruthenium (Ru), iridium (Ir), silver (Ag), aluminum (Al), titanium (Ti), tantalum (Ta), tungsten (W), silicon (Si), copper (Cu), nickel (Ni), cobalt (Co), or molybdenum (Mo). Alternatively, the conductive layers may include a conductive nitride of any of the above-stated metal (e.g., TiN, MoN, etc.), a conductive oxynitride of any of the above-stated metal (e.g., TiON) or a combination thereof (e.g., TiSiN, TiAlON, etc.). However, the above-stated materials are merely examples, and the present invention is not limited thereto. For example, the conductive layers may include poly-silicon heavily doped with impurities.

Referring to FIG. 4, the 3D semiconductor memory device includes the plurality of conductive line patterns 20*ap* and 20*bp* that are separated from one another in parallel and the plurality of conductive planes WP1, WP2, and WP3 which cross the conductive line patterns 20*ap* and 20*bp*. The insulation layer patterns 60LP may be arranged between the plurality of conductive planes WP1, WP2, and WP3 to mechanically support the plurality of conductive planes WP1, WP2, and WP3 and insulating the plurality of conductive planes WP1, WP2, and WP3 from one another.

Each of the plurality of conductive planes WP1, WP2, and WP3 includes a plane pattern having a predetermined width w. The plane pattern may extend in the second direction (the y-axis direction) and the third direction (the z-axis direction), which differ from the first direction (the x-axis direction). The plane patterns are separated from one another in parallel in the first direction (the x-axis direction) and cross the plurality of conductive lines BL11, BL12, and BL13; BL21, BL22, and BL23, thereby defining the regions of intersection SR.

The non-volatile data storage layer patterns SM for storing bits are respectively arranged at the regions of intersection SR at which the plurality of conductive lines BL11, BL12, and BL13; BL21, BL22, and BL23 and the plurality of conductive planes WP1, WP2, and WP3 cross, and the non-volatile data storage layer pattern SM respectively define memory cells.

As shown in FIG. 4, the non-volatile data storage layer pattern SM may be locally arranged in the regions of intersection SR between the plurality of conductive planes WP1, WP2, and WP3 having the width w and the plurality of conductive lines BL11, BL12, and BL13; BL21, BL22, and BL23 crossing the same, thereby embodying cell separation. However, it is merely an example, and, as long as change of resistances of the non-volatile data storage layers locally occurs only in the regions of intersection SR, the non-volatile data storage layer pattern SM may not only be arranged in the regions of intersection SR, but also extend onto portions at which the insulation layer patterns 60LP and the conductive line patterns 20ap and 20bp cross each others.

FIGS. 5A through 5F are perspective diagrams showing a method of fabricating a 3D non-volatile memory device according to another embodiment of the present invention in an order. FIG. 6 is a sectional view obtained along a line VI-VI' of FIG. 5F. Here, descriptions of elements denoted by the same reference numerals as the elements described above may refer to the descriptions of the elements given above as long as there is no contradiction.

Figure 5A:
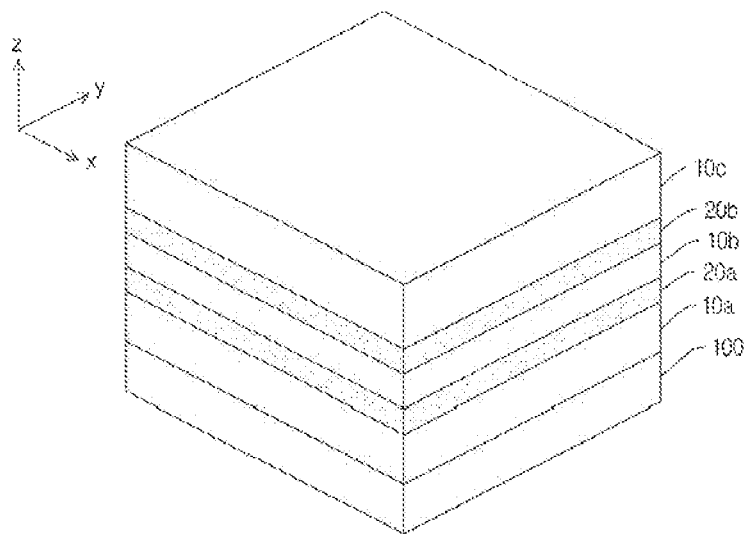
FIGS. 5A through 5F are perspective diagrams showing a method of fabricating a 3D non-volatile memory device according to another embodiment of the present invention in an order.
Figure 6:
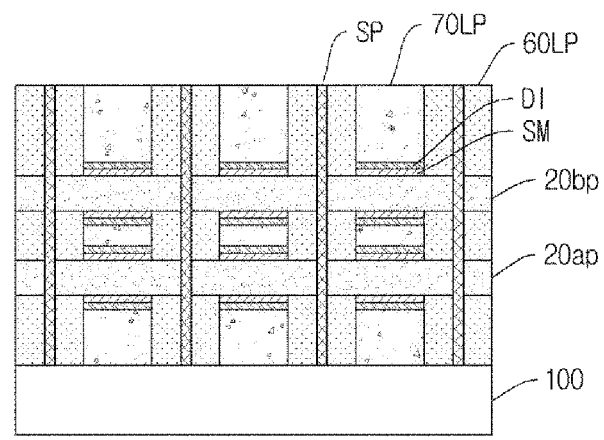
FIG. 6 is a sectional view obtained along a line VI-VI' of FIG. 5F.

Referring to FIG. 5A, the first sacrifice layers 10a, 10b, and 10c and the conductive layers 20a and 20b may be alternately and repeatedly stacked on the substrate 100. As described above, thicknesses of the first sacrifice layers 10a, 10b, and 10c and the conductive layers 20a and 20b stacked on the substrate 100 may be appropriately selected.

Figure 5B:
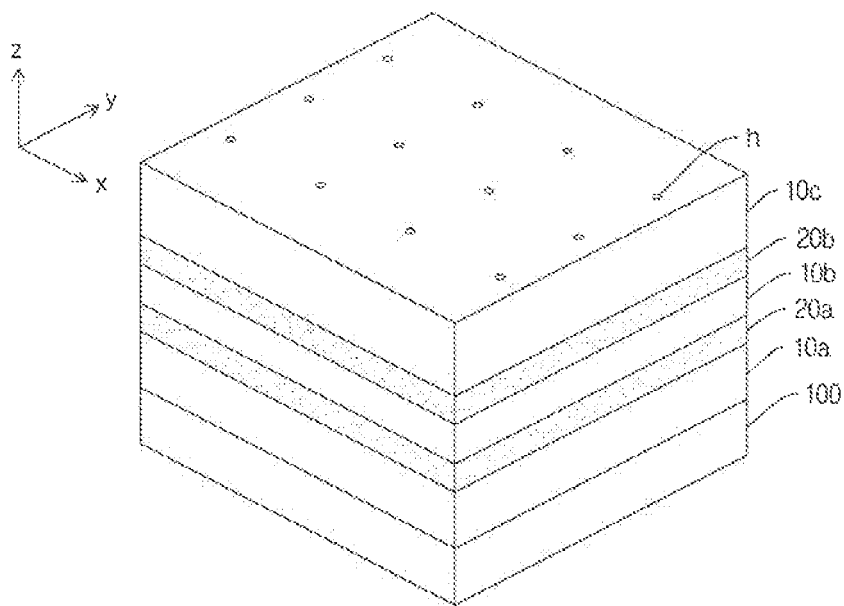

Referring to FIG. 5B, a plurality of penetration holes H penetrating through the structure in which the first sacrifice layers 10a, 10b, and 10c and the conductive layers 20a and 20b are alternately and repeated stacked may be formed by forming suitable mask layers on the structure via a photolithography operation and a patterning operation thereafter. The penetration holes H may be formed in a direction perpendicular to the main surface of the substrate 100, that is, the z-axis direction. The penetration holes H penetrate a plurality of conductive line patterns (20ap and 20bp of FIG. 5F) formed in a later operation, but the penetration holes H may be formed in regions at which the conductive line patterns 20ap and 20bp and the conductive planes 70LP do not cross. Detailed descriptions thereof will be given below.

Figure 5C:
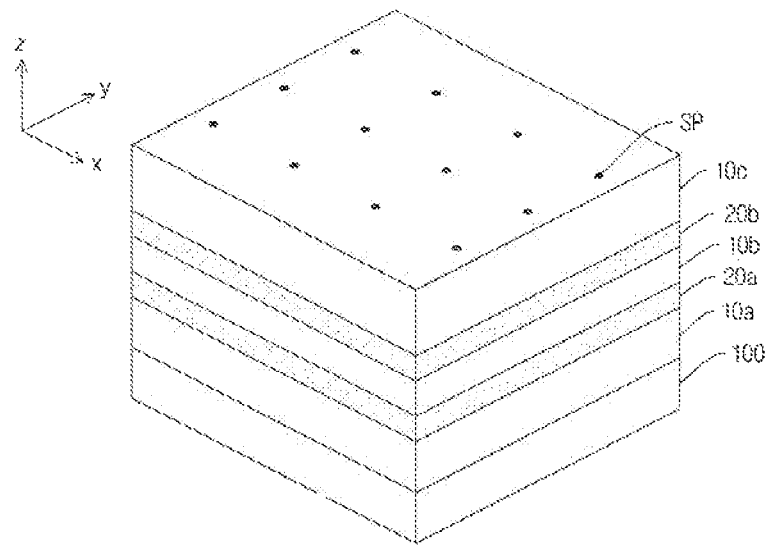

Referring to FIG. 5C, a supporting structures SP may be formed by forming an insulation layer on the structure and planarizing the insulation layer via an etch back operation or a chemical-mechanical polishing operation, in which the first sacrifice layers 10a, 10b, and 10c and the conductive layers 20a and 20b are alternately and repeated stacked, to fill the penetration holes H. The supporting structure SPs may have a pillar-like shape and may completely fill the penetration holes H as shown in FIG. 5C. However, the present invention is not limited thereto. For example, if insulation layers having a constant thickness are formed on inner sidewalls of the penetration holes H, the supporting structures SP having a hollow pipe-like shape may be provided. Furthermore, the cross-sectional shape of the supporting structures SP may have not only a circular pattern as shown in FIG. 5C, but also an elliptical pattern or a polygonal pattern (e.g., a rectangular pattern).

The supporting structures SP may be formed of a material having an etching selectivity with respect to the stacked first sacrifice layers 10a, 10b, and 10c. For example, if the first sacrifice layers 10a, 10b, and 10c are formed of a silicon oxide, the supporting structures SP may be formed of a silicon nitride. Furthermore, the supporting structures SP may be formed of a same material as insulation layer patterns (60LP of FIG. 6) formed in a later operation. However, the above-stated materials are merely examples, and the present invention is not limited thereto.

Figure 5D:
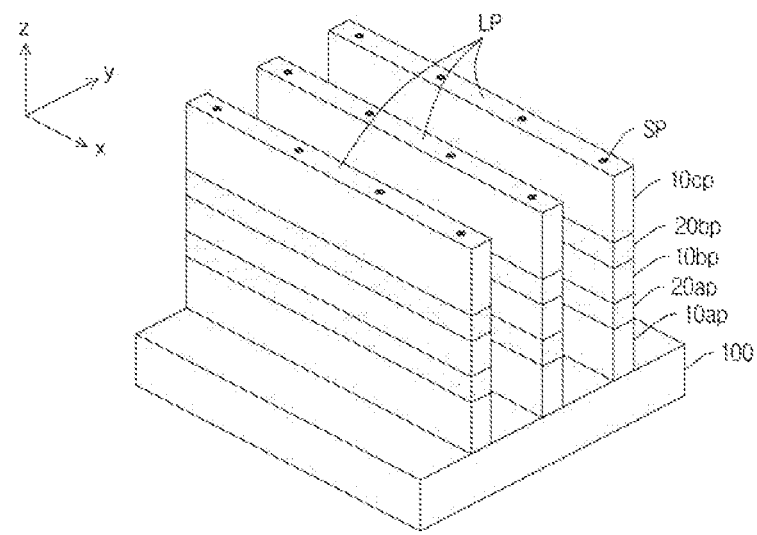

Referring to FIG. 5D, on the structure in which the supporting structures SP are formed, the first etching mask M1 having a linear pattern may be provided. The linear pattern of the first etching mask M1 may extend in the first direction (e.g., the x-axis direction) that is parallel to the substrate 100.

Next, a plurality of stacked linear patterns LP which extend in the x-axis direction and are separated from one another in parallel in a second direction (e.g., the y-axis direction) that is different from the x-axis direction, are formed by successively patterning the first sacrifice layers 10a, 10b, and 10c and the conductive layers 20a and 20b by using the first etching mask M1 as an etching mask. The patterning operation may be performed via a dry etching operation, such as reactive ion etching. In the stacked linear patterns LP, first sacrifice layer patterns 10ap, 10bp, and 10cp originated from the first sacrifice layers 10a, 10b, and 10c and conductive line patterns 20ap and 20bp originated from the conductive layers 20a and 20b may be repeatedly stacked.

Figure 5E:
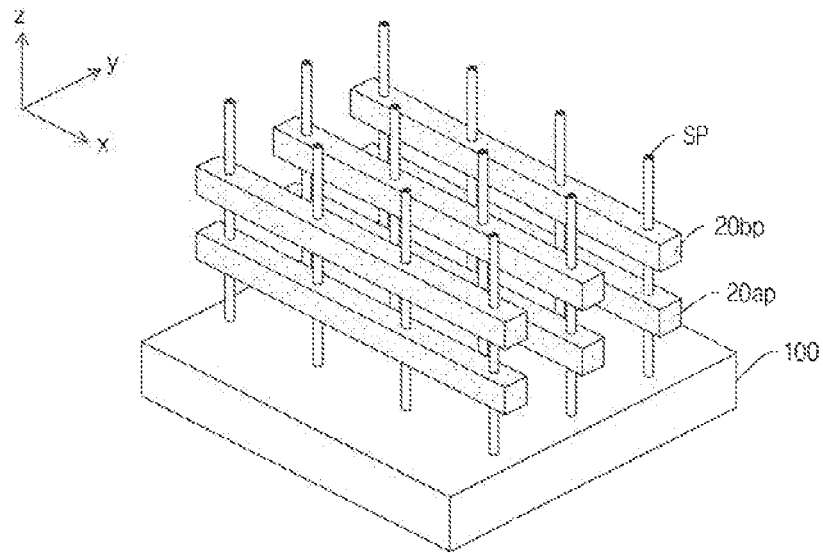

Referring to FIG. 5E, the conductive line patterns 20ap and 20bp are exposed by removing portions of first sacrifice layer patterns 10ap, 10bp, and 10cp in the stacked linear patterns LP. To remove the first sacrifice layer patterns 10ap, 10bp, and 10cp, an etching operation using an etching selectivity between the first sacrifice layer patterns 10ap, 10bp, and 10cp and the supporting structures SP may be performed. The etching operation may be performed via an isotropic etching operation, such as a wet etching. During the removing operation, the conductive line patterns 20ap and 20bp may be mechanically supported by the supporting structures SP.

Next, referring to FIG. 3D through 3J, the film forming operations and the patterning operations described above may be performed. For example, as shown in FIG. 3D, the non-volatile data storage layers 30L may be formed on the exposed conductive line patterns 20ap and 20bp. Next, as shown in FIG. 3E, the diode layers 40L may be formed on the non-volatile data storage layers 30L. According to another embodiment of the present invention, the diode layers 40L may be formed on the exposed conductive line patterns 20ap and 20bp, and then the non-volatile data storage layers 30L may be formed on the diode layers 40L. According to another embodiment of the present invention, insertion electrode layers (IM of FIG. 1C) may be further formed between the non-volatile data storage layers 30L and the diode layers 40L. The non-volatile data storage layers 30L, the diode layers 40L, and the insertion electrode layers IM may be formed via a chemical vapor deposition or an atomic layer deposition for uniform deposition.

Selectively, as shown in FIG. 3F, the second sacrifice layers 50L may be formed on the substrate 100 to cover the conductive line patterns 20ap and 20bp on which the non-volatile data storage layers 30L and the diode layers 40L are formed. The second sacrifice layers 50L may be insulation layers having etching selectivity with respect to insulation layer patterns (60LP of FIG. 2I) described below. Next, the second etching mask layer M2 having a linear pattern may be provided on the second sacrifice layers 50L. The second etching mask layer M2 may extend in a second direction (e.g., the y-axis direction) that is different from the x-axis direction.

Next, as described above with reference to FIG. 3G, the second sacrifice layer patterns 50LP, which cross the conductive line patterns 20*ap* and 20*bp* having stacked thereon the non-volatile data storage layers 30L and the diode layers 40L, may be formed by patterning the second sacrifice layers 50L by using the second etching mask layer M2 as an etching mask. The second sacrifice layer patterns 50LP may extend in the y-axis direction and may be separated from one another in parallel along the x-axis direction. Therefore, first portions of the conductive line patterns 20*ap* and 20*bp* having formed thereon the non-volatile data storage layers 30L and the diode layers 40L may be exposed between the second sacrifice layer patterns 50LP.

Next, as described above with reference to FIG. 3H, surfaces of the conductive line patterns 20*ap* and 20*bp* are exposed by successively removing the non-volatile data storage layers 30L and the diode layers 40L on the first portions of the conductive line patterns 20*ap* and 20*bp* exposed between the second sacrifice layer patterns 50LP by using the second sacrifice layer patterns 50LP as an etching mask, thereby embodying cell separation between memory cells adjacent to one another. As described above, according to another embodiment of the present invention, only the diode layers 40L which may interrupt electric separation between memory cells may be removed.

Next, referring to FIG. 3I, insulation layer patterns 60LP are formed on the structure, in which cell separation is completed, between the second sacrifice layer patterns 50LP to cover portions of the exposed conductive line patterns 20*ap* and 20*bp*. The insulation layer patterns 60LP may be formed by forming suitable insulation layers on the second sacrifice layer patterns 50LP to cover the gaps between the second sacrifice layer patterns 50LP and performing a planarizing operation, such as an etch back operation or a chemical-mechanical polishing operation.

Next, as described above with reference to FIG. 3J, second portions of the conductive line patterns 20*ap* and 20*bp* having formed thereon the non-volatile data storage layer patterns 30LP and the selection diode layer patterns 40LP are exposed between the insulation layer patterns 60LP by removing the second sacrifice layer patterns 50LP. Next, as described above with reference to FIG. 3K, conductive planes 70LP are formed between the insulation layer patterns 60LP to cover the second portions of the conductive line patterns 20*ap* and 20*bp* having formed thereon the non-volatile data storage layer patterns 30LP and the selection diode layer patterns 40LP.

Figure 5F:
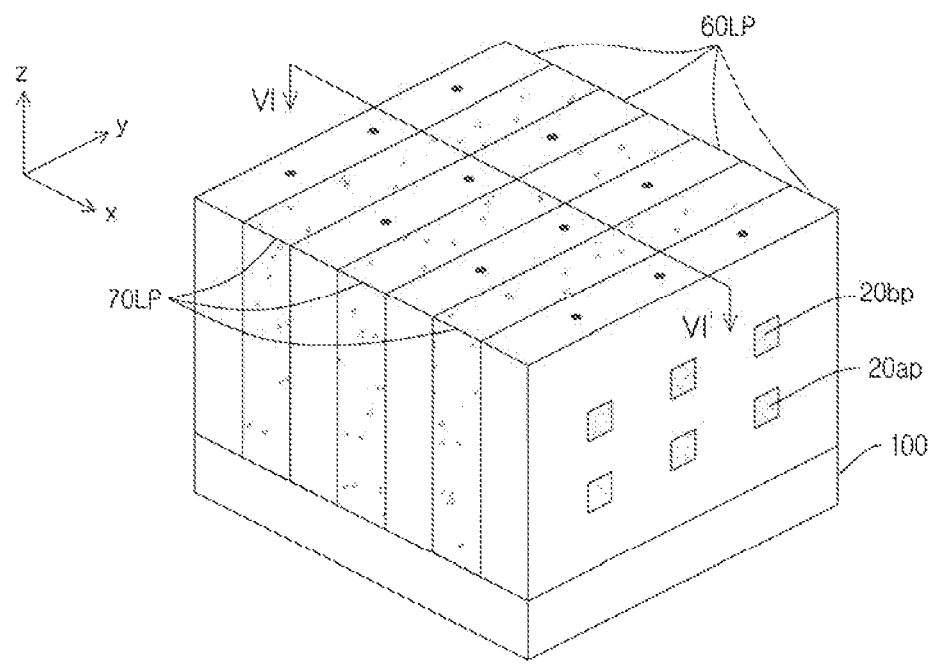

By performing the operations as described above, a 3D semiconductor memory device as shown in FIG. 5F may be fabricated. Unlike the 3D semiconductor memory device of FIG. 4, the 3D semiconductor memory device of FIG. 5 includes the supporting structures SP which penetrate the plurality of conductive line patterns 20*ap* and 20*bp* that are separated from one another in parallel.

Although FIG. 6 shows that the supporting structures SP are formed between memory cells, it is merely an example. The supporting structures SP may be formed between blocks of memory cells or between groups of memory cells each of which includes two or more memory cells.

The above-stated embodiments relate to non-volatile memory devices in which the plurality of conductive lines BL11, BL12, and BL13; BL21, BL22, and BL23 are conductive patterns extending in the first direction (e.g., the x-axis direction) parallel to the main surface of the substrate 100, it is merely an example. For example, the plurality of conductive lines BL11, BL12, and BL13; BL21, BL22, and BL23 may be 3-dimensionally arranged by extending in a direction perpendicular to the substrate 100 (that is, the z-axis direction) and being arranged to be separated from one another in parallel in the x-axis direction and the y-axis direction in parallel. It should be understood that the 3D arrangement is also within the scope of the present application.

Figure 7A:
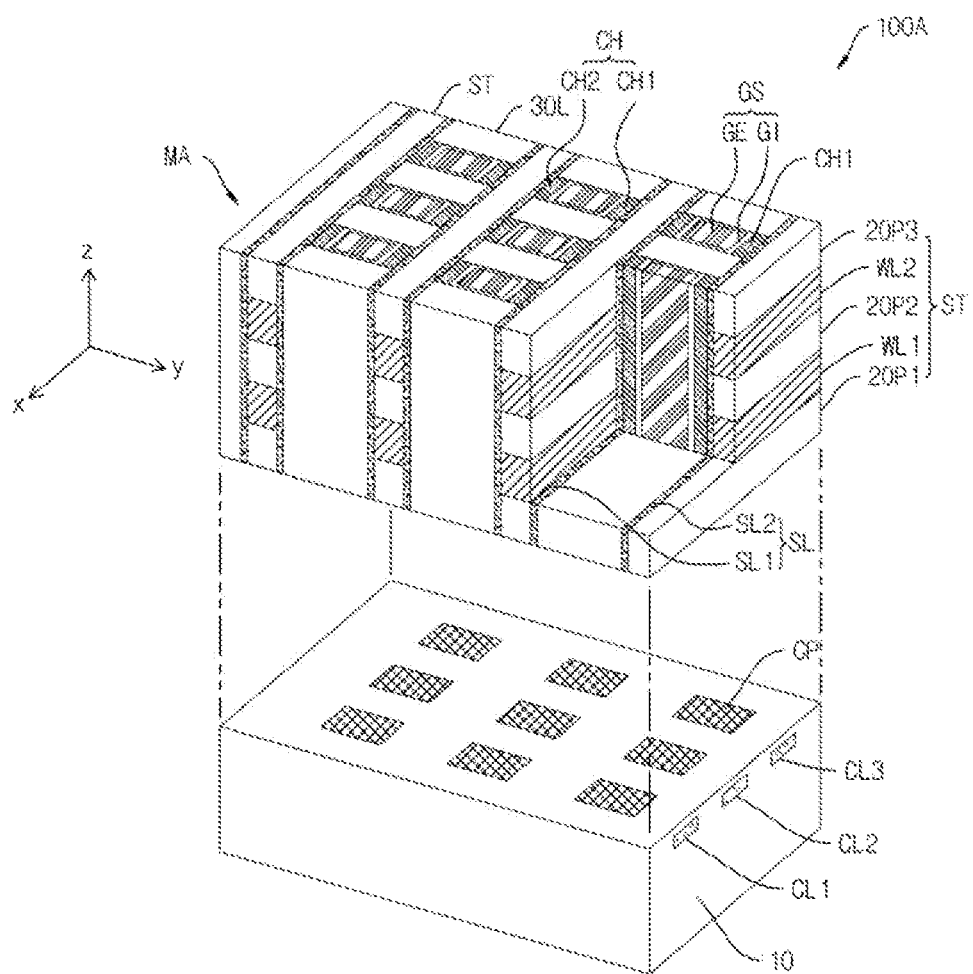
FIGS. 7A and 7B are schematic perspective diagrams showing cell arrays of 3D non-volatile memory devices according to embodiments of the present invention.
Figure 7B:
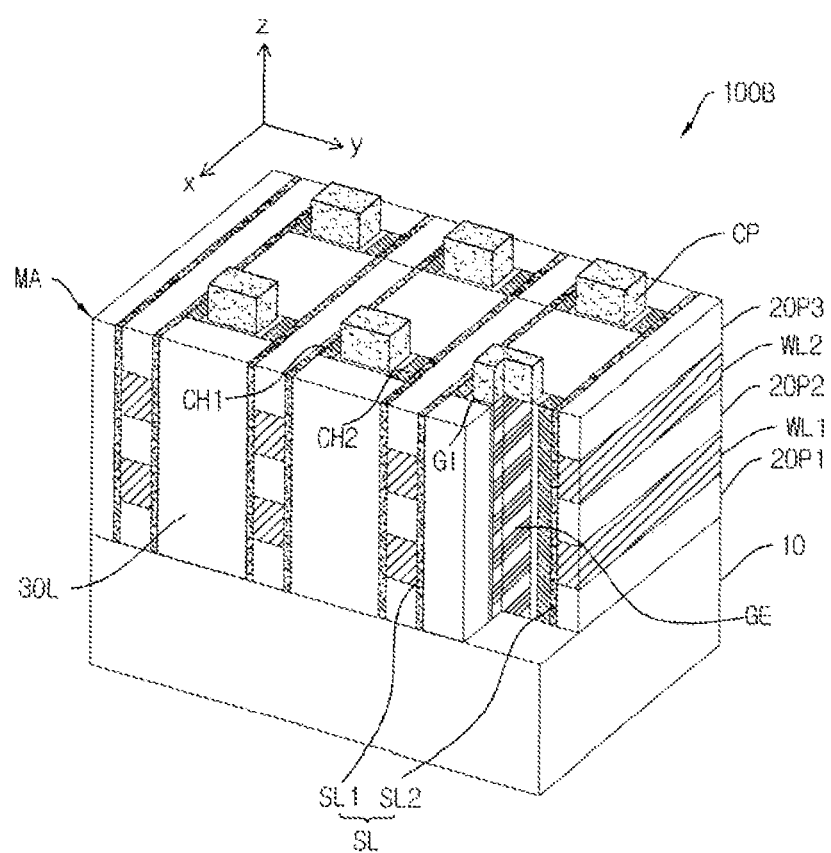
Figure 8:
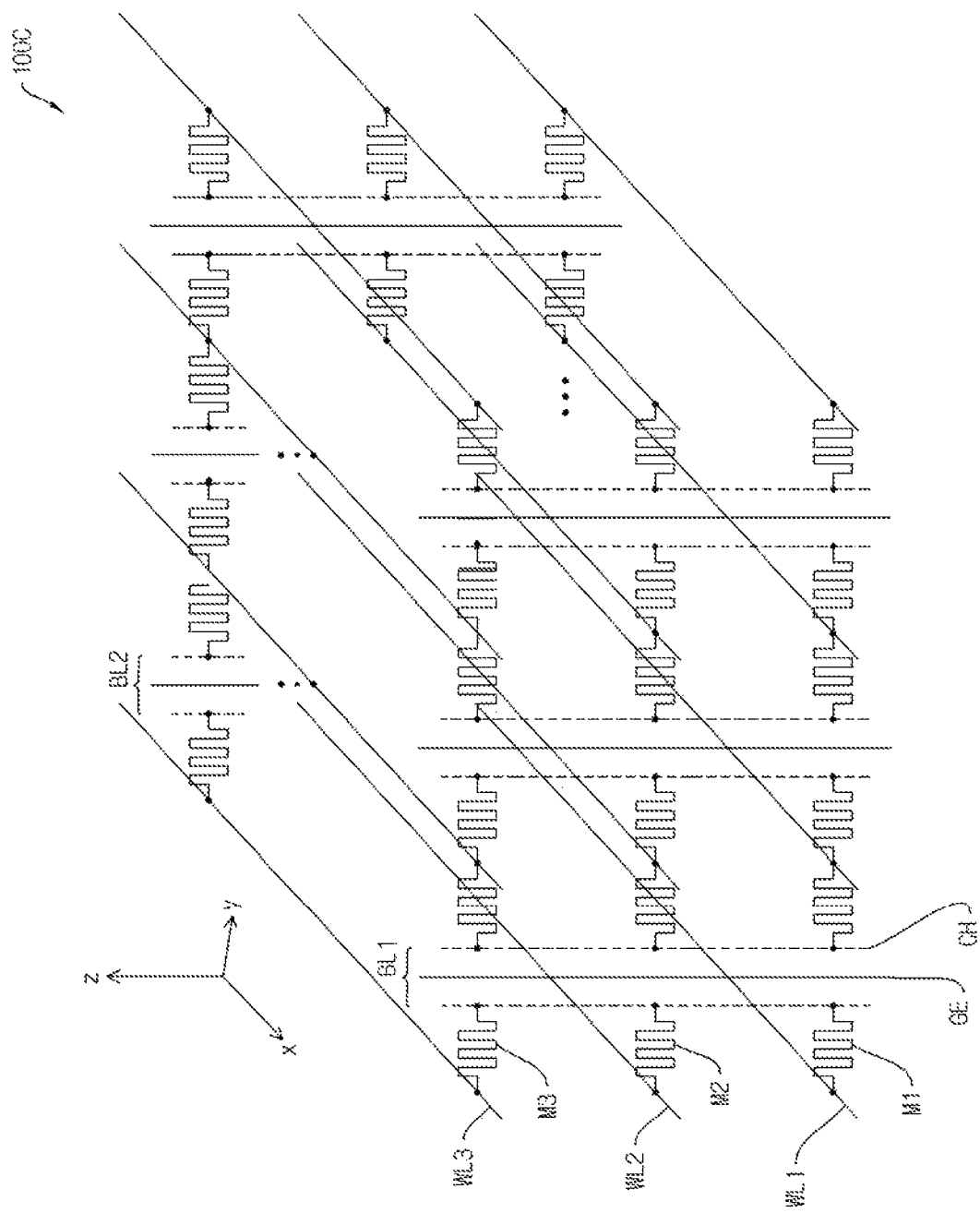
FIG. 8 is a circuit diagram of a 3-dimensionally non-volatile memory device according to an embodiment of the present invention.

FIGS. 7A and 7B are schematic perspective diagrams showing cell arrays of 3D non-volatile memory devices 100A and 100B according to embodiments of the present invention, and FIG. 8 is a circuit diagram of a 3-dimensionally non-volatile memory device according to an embodiment of the present invention.

Referring to FIG. 7A, the non-volatile memory device 100A includes a plurality of conductive lines WL1 and WL2 which are stacked on a substrate 10 in a vertical direction, e.g., the z-axis direction. As shown in FIG. 7A, the plurality of conductive lines WL1 and WL2 may be conductive patterns extending in the first direction (e.g., the x-axis direction) parallel to the main surface of the substrate 10. The plurality of conductive lines WL1 and WL2 may be 3-dimensionally arranged by being arranged to be separated from one another in parallel in the second direction (e.g., the y-axis direction) and the third direction (e.g., the z-axis direction) that differ from the x-axis direction.

Electric separation between the plurality of conductive lines WL1 and WL2 may be embodied by interlayer insulation layer patterns 20P1, 20P2, and 20P3 arranged therebetween. The stacked structure in which the plurality of conductive lines WL1 and WL2 and the interlayer insulation layer patterns 20P1, 20P2, and 20P3 are stacked in the z-axis direction defines a plurality of wiring stacks ST on the substrate 10, where the plurality of wiring stacks ST may be 2-dimensionally arranged by being separated from one another at a constant interval in the y-axis direction.

Although the plurality of conductive lines WL1 and WL2 are repeatedly arranged for four times in the y-axis direction in the 3-dimensional arrangement of the plurality of conductive lines WL1 and WL2 shown in FIG. 7A, it is merely an example, and the plurality of conductive lines WL1 and WL2 may be repeatedly arranged for twice, five times, or a larger number of times. Furthermore, the plurality of conductive lines WL1 and WL2 are repeatedly arranged for twice in the z-axis direction in the 3-dimensional arrangement of the plurality of conductive lines WL1 and WL2 shown in FIG. 7A, it is merely an example, and the plurality of conductive lines WL1 and WL2 may be repeatedly arranged for three times or a larger number of times.

Although the plurality of conductive lines WL1 and WL2 have a solid form in the embodiment shown in FIG. 7A, the present invention is not limited thereto, and the plurality of conductive lines WL1 and WL2 may also have a hollow pipe-like form. Furthermore, surfaces of the plurality of conductive lines WL1 and WL2 may have a 3-dimensional pattern including grooves to locally define programmable regions of data storage layers SL. Detailed descriptions thereof will be given below with reference to FIG. 9B.

The non-volatile memory device 100A may include the data storage layers SL, which are formed on sidewalls of the plurality of wiring stacks ST and are electrically connected to the plurality of conductive lines WL1 and WL2. The data storage layers SL are arranged on two opposite sidewalls of the plurality of wiring stacks ST and may be electrically connected to the data storage layers SL in common, where the plurality of conductive lines WL1 and WL2 are arranged the two opposite sidewalls of the data storage layers SL. Furthermore, the data storage layers SL may be arranged on two opposite sidewalls of the data storage layers SL adjacent to one another and may face each others. Here, the data storage layers SL facing each other will be referred to hereinafter as first data storage layers SL1 and second data storage layers SL2, respectively.

To provide non-volatile solid-state memory cells, the data storage layers SL may contain a phase change material, a variable resistive material, a programmable metallization cell (PMC), a magnetic material, or a combination thereof. However, the present invention is not limited thereto, and any of various other programmable materials may be used. The structure of the data storage layers SL and materials constituting the same will be described below with reference to FIGS. 9A and 9B.

Channel layers CH including channels and control gate structures GS for controlling electric conductivity of the channels may be sequentially provided on surfaces of the data storage layers SL opposite to surfaces on which the plurality of conductive lines WL1 and WL2 are arranged. As shown in FIG. 7A, the channel layers CH may define points of intersection with the plurality of conductive lines WL1 and WL2 by extending across the plurality of conductive lines WL1 and WL2. As shown in FIG. 7A, one channel layer CH extends in a direction perpendicular to the substrate 10, that is, the z-axis direction and defines points of intersection in the z-axis direction with the plurality of conductive lines WL1 and WL2, which are vertically stacked. Furthermore, the channel layers CH may be arranged in the x-axis direction, the y-axis direction, and 2-dimensionally, the points of intersection are 3-dimensionally arranged, and thus memory cells defined at the points of intersection may be 3-dimensionally arranged.

The channel layers CH may contain monocrystalline or polycrystalline semiconductor materials. For example, the semiconductor materials may include silicon (Si), germanium (Ge), silicon-germanium compounds, and group III-V semiconductor materials, such as GaAs and InP. However, the above-stated materials are merely examples, and the present invention is not limited thereto. For example, the channel layers CH may provide channels by using semiconductor materials, such as carbon nanotubes, graphene, or metal oxides. As an occasion demands, the channel layers CH may be doped with impurities for forming an appropriate N-type or P-type semiconductor.

To control electric conductivity of the channel layers CH, the control gate structures GS are arranged to contact the channel layers CH, where the control gate structures GS may include gate insulation layers GI and gate electrodes GE. The control gate structures GS also extends in the z-axis direction along with the channel layers CH and may be 2-dimensionally arranged by being separated from one another on the substrate 10 in the x-axis direction and the y-axis direction. Materials constituting the gate insulation layers GI and the gate electrodes GE may include conductive materials, such as silicon oxides, polysilicon, or metals.

To control electric conductivity of the channel layers CH, the control gate structures GS are arranged to contact the channel layers CH, where the control gate structures GS may include gate insulation layers GI and gate electrodes GE. The control gate structures GS also extends in the z-axis direction along with the channel layers CH and may be 2-dimensionally arranged by being separated from one another on the substrate 10 in the x-axis direction and the y-axis direction. Materials constituting the gate insulation layers GI and the gate electrodes GE may include conductive materials, such as silicon oxides, polysilicon, or metals.

As shown in FIG. 7A, if the first and second data storage layers SL1 and SL2 facing each others are provided at the data storage layers SL adjacent to one another, first channel layers CH1 and second channel layers CH2 may be formed to contact the first and second data storage layers SL1 and SL2, respectively. In this case, if the control gate structure GS is arranged between the first channel layer CH1 and the second channel layer CH2 facing each other to contact both the first channel layer CH1 and the second channel layer CH2, the control gate structures GS may function as the common control gate structures GS. The common control gate structures GS may control electric conductivities of both the first channel layer CH1 and the second channel layer CH2 via a single control gate structure, integration and circuit configuration of a non-volatile memory device may be simplified.

As described above, points of intersection are defined by the plurality of conductive lines WL1 and WL2 and the channel layers CH1 and CH2 crossing each others, where regions of the data storage layers SL located at the points of intersection may define unit memory cells. In terms of operation, the plurality of conductive lines WL1 and WL2 may function as word lines, whereas the first and second channel layers CH1 and CH2 of which electric conductivities are controlled by the control gate structures GS may function as bit lines. Alternatively, the plurality of conductive lines WL1 and WL2 may function as bit lines, whereas the first and second channel layers CH1 and CH2 may function as word lines. The unit memory cells may be randomly accessed by selecting a plurality of conductive lines to which the memory cells are electrically and respectively connected and the control gate structures GS and applying appropriate signals thereto.

In the above-stated embodiments, conduction states of the first and second channel layers CH1 and CH2 may be turned ON/OFF by a control gate structure combined therewith. Therefore, rectification elements, such as diodes, that are applied to prevent interferences between cells adjacent to one another in crossbar type resistive random access memories (ReRAM) or phase change random access memories (PcRAM) in the related art may be omitted.

According to embodiments of the present invention, the non-volatile memory device 100A may further include corresponding wiring structures for electric connections among the plurality of conductive lines WL1 and WL2, the channel layers CH, and driving circuits of the control gate structures GS. For example, for electric connection to the control gate structures GS, as shown in FIG. 7A, the wiring structures may include lower rewiring structures CL1, CL2, and CL3 formed on the substrate 10, where the lower rewiring structures CL1, CL2, and CL3 may be impurity regions formed at the substrate 10 or conductive patterns like metal wirings.

The impurity regions may be formed at the substrate 10 in advance before a memory cell array MA is formed. For ohmic contact between the lower rewiring structures CL1, CL2, and CL3 and the gate electrodes GE, additional layers cp may be formed. The lower rewiring structures CL1, CL2, and CL3 may have an appropriate configuration for independently accessing the control gate structures GS, and electric connections to the control gate structures GS may be established by being exposed to different lengths from an end of a cell region. In the same regard, ends of the channel layers CH may have appropriate lower rewiring structures.

Referring to FIG. 7B, the non-volatile memory device 100B according to another embodiment of the present invention may be substantially identical to the non-volatile memory device 100A shown in FIG. 7A except for configuration of a wiring structure for electric connection of the control gate structures GS.

The control gate structures GS for controlling the first and second channel layers CH1 and CH2 which cross the plurality of conductive lines WL1 and WL2 for accessing memory cells may be electrically connected to appropriate upper rewiring structures via conductive plugs CP formed on top of the memory cell array MA and accessed. As an occasion demands, the upper rewiring structures and the lower rewiring structures may be combined with each others, or a stacked rewiring structure may be formed by forming the conductive plugs CP to have different heights. Furthermore, it will be understood that the control gate structures GS described above may be wiring structures for channel layers or wiring structures for channel layers may be separately formed.

FIG. 8 is a circuit diagram of cell arrays 100C of the non-volatile memory devices 100A and 100B as described above. Referring to FIGS. 7A, 7B, and 8, word lines WL1, WL2, and WL3 may correspond to the plurality of conductive lines WL1 and WL2, whereas bit lines BL1 and BL2 may correspond to the channel layers CH. Furthermore, gate electrodes for controlling the bit lines BL1 and BL2 may be connected to rewiring structures and may be independently accessed. The terms word line and bit line may be intercompatibly used, and the present invention is not limited by the terms.

The numbers of the bit lines BL1 and BL2 and the word lines WL1, WL2, and WL3 may be appropriately determined based on memory capacity and driving method. For example, the numbers of the bit lines BL1 and BL2 and the word lines WL1, WL2, and WL3 may be determined, such that the number of memory cells that are arranged in the x-axis direction, the y-axis direction, and the z-axis direction to form a 3D arrangement is 2m (m is a natural number) in each of the directions, and the 3D arrangement may be designed based on appropriate blocks and page unit for high-speed byte-addressing. According to an embodiment of the present invention, two memory cells connected to two opposite ends of the one control gate structure GS may be jointly controlled by the one control gate structure GS, and thus high integration may be embodied.

Memory cells M1, M2, and M3 embodied by the data storage layers SL of FIG. 7A are electrically connected to points of intersection at which the word lines WL1, WL2, and WL3 and the bit lines BL1 and BL2 cross each others. The memory cells M1, M2, and M3 may be single resistive memory devices as shown in FIG. 8. However, it is merely an example. For example, as described below with reference to FIGS. 9A and 9B, the data storage layers SL may be various configured. For example, by connecting a plurality of resistive memory devices in series or in parallel, various programming resistance levels may be provided, e.g., R1<R2<R3<R4. As a result, a memory cell capable of storing multi-bit data, such as 00, 01, 10, and 11, may be embodied.

Figure 9A:
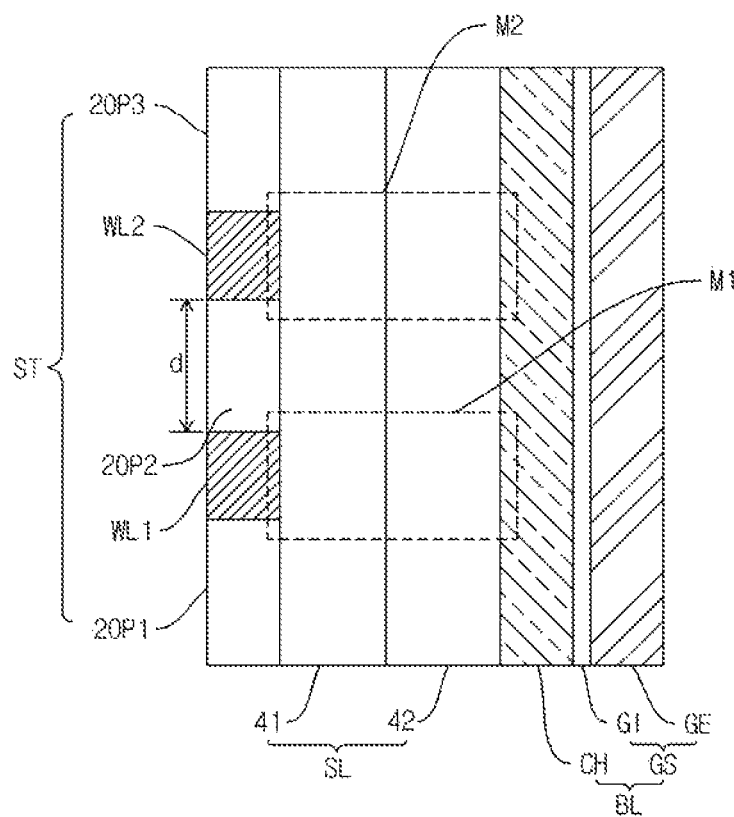
FIGS. 9A and 9B are sectional diagrams showing the structures of data storage layers of memory cells according to embodiments of the present invention.
Figure 9B:
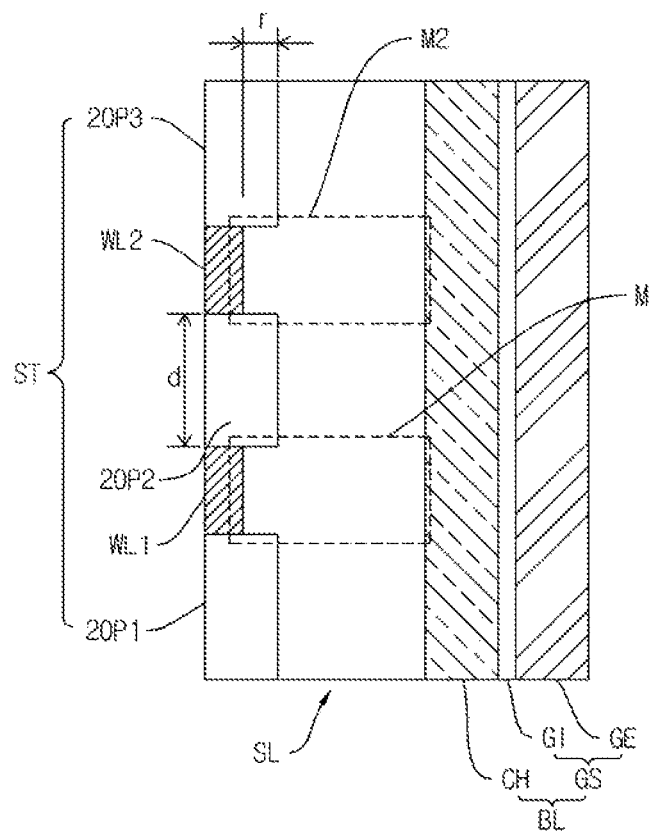

FIGS. 9A and 9B are sectional diagrams showing the structures of the data storage layers SL of memory cells M according to embodiments of the present invention.

Referring to FIG. 9A, the data storage layer SL is interposed between the conductive lines WL1 and WL2 and the channel layer CH. Since the channel layer CH extends across the conductive lines WL1 and WL2, points of intersection (also referred to as regions of intersection) may be defined, and the points of intersection of the data storage layers SL may define non-volatile memory cells M1 and M2, respectively.

Operation characteristics of the non-volatile memory cells M1 and M2 may be determined based on the data storage layers SL. As described above, to provide non-volatile solid-state memory cells, the data storage layers SL may contain a phase change material, a variable resistive material, a programmable metallization cell (PMC), a magnetic material, or a combination thereof.

The phase change material is a material which may be reversibly changed from amorphous state to crystalline state or vice versa, where electric resistances in each of the above-stated states are different from each other. Generally, the phase change material exhibits a relatively high resistance in amorphous state and a relatively low resistance in crystalline state. The phase change material may contain a GeSbTe-based material, that is, a Calcogenide based compound, such as $GeSb_2Te_3$, $Ge_2Sb_2Te_5$, $GeSb_2Te_4$, or a combination thereof. Phase change materials other than the above-state materials include GeTeAs, GeSnTe, SeSnTe, GaSeTe, GeTe-SnAu, $SeSb_2$, InSe, GeTe, BiSeSb, PdTeGeSn, InSeTiCo, InSbTe, $In_3SbTe_2$, $GeTeSb_2$, $GeTe_3Sb$, GeSbTePd, and AgInSbTe. However, the above-stated materials are merely examples, and the present invention is not limited thereto. Furthermore, a material formed by implanting non-metal atoms, such as B, C, N, and P, to any of the above-stated materials may also be used.

According to another embodiment of the present invention, the data storage layers SL may contain the variable resistive material of which electric resistance may be reversibly changed by an electric signal. The variable resistive material is a material which may be changed between a low resistance state and a high resistance state by electric signals, like the phase change material. Examples of the variable resistive materials include Perovskite oxides, such as $SrTiO_3$, $SrZrO_3$, and $Nb:SrTiO_3$, or transition metal oxides, such as $TiO_x$, NiO, $TaO_x$, $HfO_x$, $AlO_x$, $ZrO_x$, $CuO_x$, $NbO_x$, and $TaO_x$, $GaO_x$, $GdO_x$, $MnO_x$ PrCaMnO, and $ZnONiO_x$.

The Perovskite oxides and the transition metal oxides exhibit characteristics of switching resistance based on electric pulses. To describe the switching characteristics, various mechanisms related to conductive pillars, interface effects, and trapped charges are suggested. However, none of the mechanisms is sufficiently clear. However, the materials commonly have factors having a kind of hysteresis inflicting electron-based effects to currents in fine structures suitable for non-volatile memory device applications, and thus the materials may be applied to the data storage layers SL.

The hysteresis may be categorized based on unipolar resistive materials, which are not affected by polarity of an applied voltage, and bipolar resistive materials. However, the present invention is not limited thereto. For example, the data storage layers SL may be formed of a unipolar resistive material only or a bipolar resistive material only. Alternatively, the data storage layers SL may be designed for multi-bit operation by including a stacked structure in which a layer formed of the unipolar resistive material and a layer formed of the bipolar resistive material are stacked.

According to another embodiment of the present invention, the data storage layers SL may include PMCs. For example, the data storage layers SL may be embodied by forming the plurality of word lines WL1 and WL2 as metal electrodes, includes a metal oxide formed of an electrochemically active (e.g., oxidizable) metal, such as silver (Ag), terrarium (Te), copper (Cu), tantalum (Ta), and titanium (Ti), and a metal oxide formed of an electrochemically inactive metal, such as tungsten (W), gold (Au), platinum (Pt), palladium (Pd), and rhodium (Rh), and arranging PMCs including an electrolyte material having super ion regions between the plurality of conductive lines WL1 and WL2 and the channel layers CH.

The PMC material exhibits resistance change or switching characteristics due to physical rearrangement of the super ion regions in the electrolyte material. The electrolyte material including super ion regions may be a base glass material, such as germanium-selenium (GeSe) compound, for example. The GeSe compound may also be referred to as a Calcogenide glass or Calcogenide material. Examples of the GeSe materials include $Ge_3Se_7$, $Ge_4Se_6$ and $Ge_2Se_3$. However, other materials may be used in other embodiments of the present invention.

According to another embodiment of the present invention, the data storage layers SL may contain a magnetic material. The magnetic material may be a compound including a combination of Mg, Ni, CO, and/or Fe, for example. In this case, the non-volatile data storage layer patterns SM may be applied as a giant magneto resistive (GMR) device and a tunneling magneto resistive (TMR) device. Particularly, in case of the TMR device, the data storage layers SL may include a magnetic tunneling junction that is obtained from a stacked structure in which a layer formed of any of the magnetic material and an appropriate insulation layer are stacked and may embody a spin torque transmitting memory known in the art.

The data storage layers SL may have a single layer formed of any of the materials described above or a stacked structure in which a plurality of layers formed of the materials described above are stacked. For example, as shown in FIG. 9A, the data storage layers SL may have a stacked structure in which layers 41 and 42 formed of the materials as described above are stacked. For example, the data storage layers SL may include two or more layers 41 and 42 that are formed of materials selected from among the phase change materials, variable resistive materials, PMCs, and magnetic materials. The stacked structures may be combined with one another and may be connected between the plurality of conductive lines WL1 and WL2 and the channel layers CH in series or in parallel.

In terms of design, for cell separation of memory cells M1 and M2 adjacent to each other and/or prevention of crosstalk therebetween (e.g., thermal interference in case of a phase change memory), a distance d between the plurality of conductive lines WL1 and WL2, which determines a distance between the memory cells M1 and M2, may be appropriately determined. According to another embodiment of the present invention, crosstalk may be reduced by effectively increasing the distance d between the memory cells M1 and M2 by reducing programmable region of the data storage layers SL. For example, as shown in FIG. 9B, the plurality of conductive lines WL1 and WL2 may be recessed by a distance r from side surfaces of the interlayer insulation layer patterns 20P1, 20P2, and 20P3 of the wiring stack ST. The etching operation may be performed by forming the plurality of wiring stacks (ST of FIG. 10C) and isotropically etching the plurality of conductive lines WL1 and WL2. Detailed descriptions thereof will be given below. As described above, when programmable region is reduced, power for driving a non-volatile memory device may also be reduced.

FIGS. 10A through 10L are perspective diagrams showing a method of fabricating a non-volatile memory device according to an embodiment of the present invention in an order. Here, descriptions of elements denoted by the same reference numerals as the elements described above may refer to the descriptions of the elements given above with reference to FIGS. 7A through 9B as long as there is no contradiction.

Figure 10A:
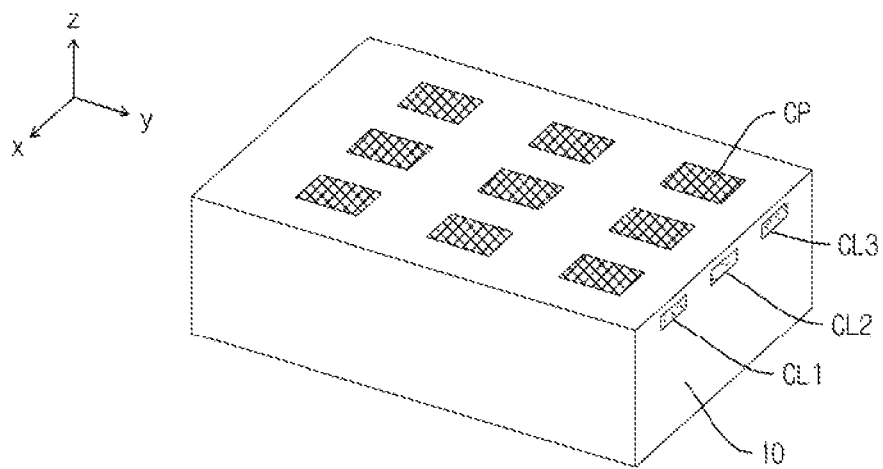

Referring to FIG. 10A, the substrate 10 is provided. The substrate may include a silicon-based base structure, such as silicon, silicon-on-insulator (SOI), silicon-germanium, or silicon-on-sapphire (SOS), or a group III-V semiconductor material, such as germanium and gallium-arsenide-based compound materials. Alternatively, the substrate 10 may include any of various materials other than the semiconductor materials stated above. The materials stated above are mere examples, and the present invention is not limited thereto.

A cell array region and a core region may be defined at the substrate 10. Since the memory cell array MA has a 3D structure, a step may be formed between the cell array region and the core region. For example, the cell array region may be defined by being etched deeper into the substrate 10 in the depthwise direction of the substrate 10 than the core region, and thus a step may be formed between the cell array region and the core region. The step is useful for forming a wiring structure for connecting a plurality of conductive lines used as word lines to an external circuit. According to embodiments of the present invention, as described above with reference to FIG. 7A, the lower rewiring structures CL1, CL2, and CL3 for electric connection of a control gate structures (GS of FIG. 7A) may be further formed on the substrate 10. As an occasion demands, wiring structures for electric connection of the channel layers CH, where the wiring structures may be identical to the lower rewiring structures CL1, CL2, and CL3.

Figure 10B:
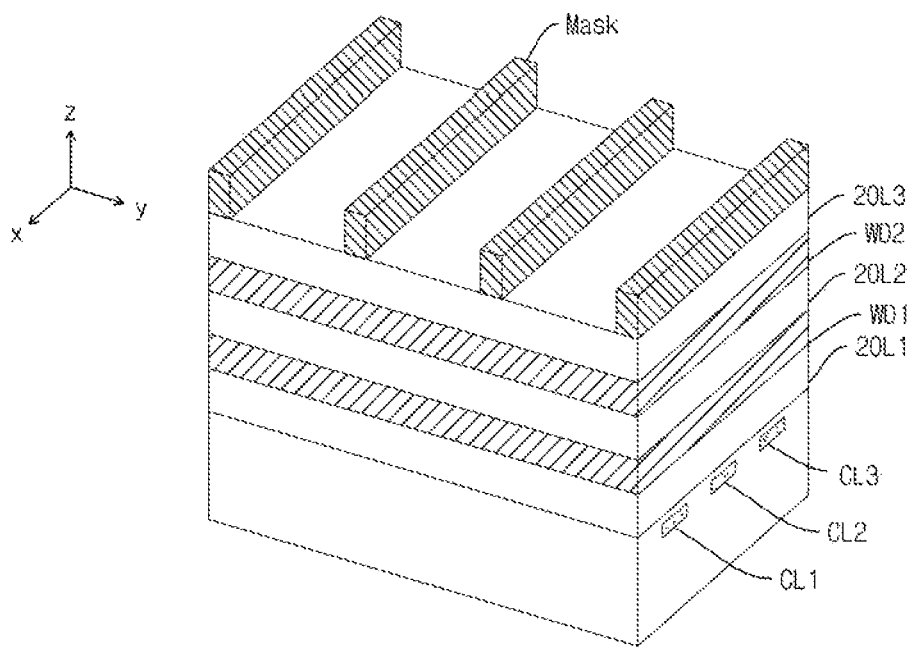

Referring to FIG. 10B, first insulation layers 20L1, 20L2, and 20L3 and first conductive layers WD1 and WD2 are alternately and repeatedly stacked on the substrate 10 in the order stated. The numbers and thicknesses of the above-stated layers may be appropriately determined. The first insulation layers 20L1, 20L2, and 20L3 may be insulation layers form of a silicon oxide, a silicon nitride, and/or a silicon oxynitride and may be formed via plasma enhanced chemical vapor deposition or chemical vapor deposition, for example.

The first conductive layers WD1 and WD2 may have a same thickness. The first conductive layers WD1 and WD2 may be formed via a physical vapor deposition, such as sputtering, or a chemical vapor deposition. The first conductive layers WD1 and WD2 becomes conductive lines (WL1 and WL2 of FIG. 7A) via a forming process of wiring stacks ST described below, and may contain a highly-conductive metal, such as platinum (Pt), ruthenium (Ru), iridium (Ir), silver (Ag), aluminum (Al), titanium (Ti), tantalum (Ta), tungsten (W), silicon (Si), copper (Cu), nickel (Ni), cobalt (Co), molybdenum (Mo), or an alloy thereof. Alternatively, the first conductive layers WD1 and WD2 may include a conductive nitride of any of the above-stated metal (e.g., TiN, MoN, etc.), a conductive oxynitride of any of the above-stated metal (e.g., TiON) or a combination thereof (e.g., TiSiN, TiAlON, etc.). However, the above-stated materials are merely examples, and the present invention is not limited thereto. For example, the first conductive layers WD1 and WD2 may include polysilicon heavily doped with impurities. The first conductive layers WD1 and WD2 may include any of various other materials as long as a reliable interface between the conductive layers 20a and 20b and the non-volatile data storage layer patterns SM may be formed.

On the structure in which the first insulation layers 20L1, 20L2, and 20L3 and the first conductive layers WD1 and WD2 are alternately and repeated stacked, a mask layer Mask having a linear pattern may be provided. The linear pattern of the mask layer Mask may extend in the first direction (e.g., the x-axis direction) that is parallel to the substrate 10.

Figure 10C:
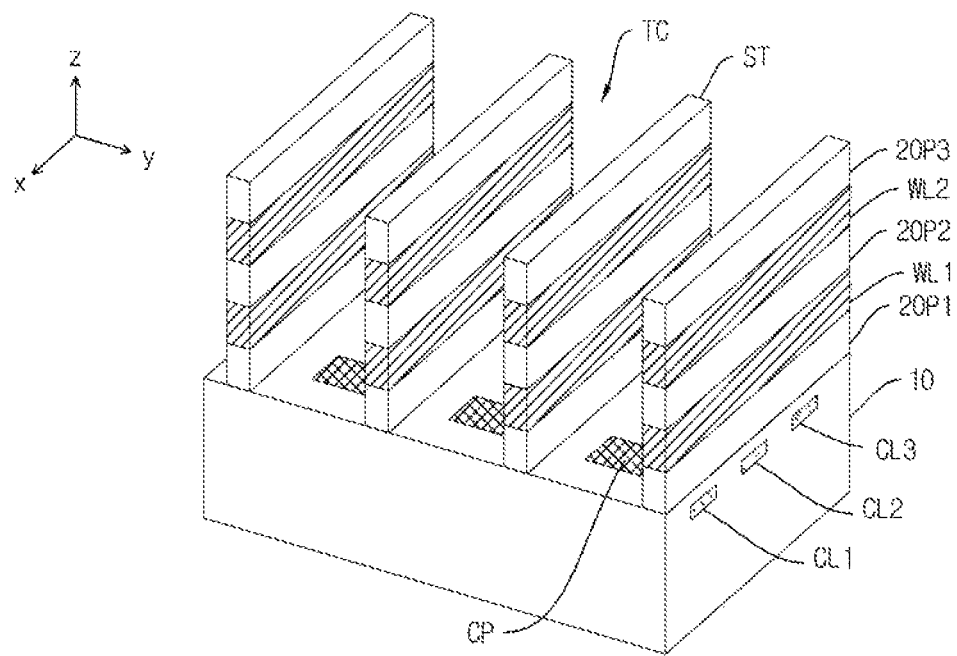

Referring to FIG. 10C, a plurality of wiring stacks ST which extend in the x-axis direction and are separated from one another in parallel in a second direction (e.g., the y-axis direction) that is different from the x-axis direction, are formed by successively patterning the first insulation layers 20L1, 20L2, and 20L3 and the first conductive layers WD1 and WD2 by using the mask layer Mask as an etching mask. The patterning operation may be performed via a dry etching operation, such as reactive ion etching. In the wiring stacks ST, interlayer insulation layer patterns 20P1, 20P2, and 20P3 originated from the first insulation layers 20L1, 20L2, and 20L3 and the plurality of conductive lines WL1 and WL2 originated from the first conductive layers WD1 and WD2 may be repeatedly stacked.

Selectively, the plurality of conductive lines WL1 and WL2 may be recessed by a distance r from side surfaces of the interlayer insulation layer patterns 20P1, 20P2, and 20P3 of the wiring stack ST. The etching operation may be performed via an isotropically etching using etching selectivity of the plurality of conductive lines WL1 and WL2 with respect to the interlayer insulation layer patterns 20P1, 20P2, and 20P3. In this case, data storage layers described below are locally provided in recessed grooves, and thus programmable region may be effectively reduced to be smaller than or equal to thicknesses of the plurality of conductive lines WL1 and WL2. As a result, power for driving a non-volatile memory device may be reduced and crosstalks between cells adjacent to one another may be prevented.

Figure 10D:
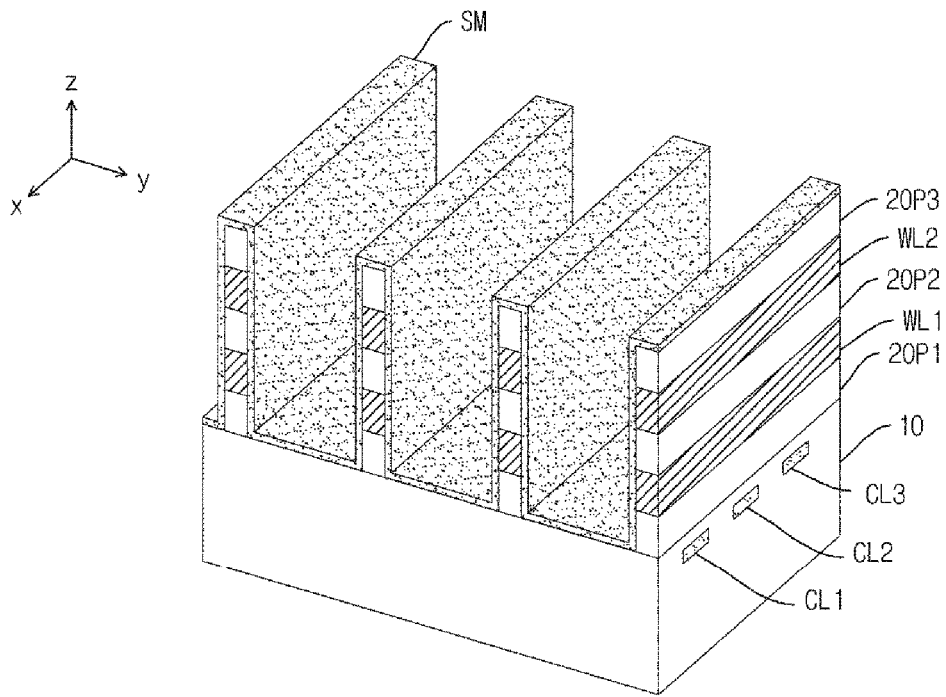

Referring to FIG. 10D, data storage material layers SM are conformally formed on the plurality of wiring stacks ST. Therefore, the non-volatile data storage layer pattern SM may be formed even on sidewalls of the plurality of wiring stacks ST facing each others to a uniform thickness. The non-volatile data storage layer pattern SM may be a single layer or, as described above with reference to FIGS. 9A and 3B, a stacked structure in which a plurality of layers including an electrode metal layer and non-volatile memory layers formed of phase change materials, for example, are stacked.

Figure 10E:
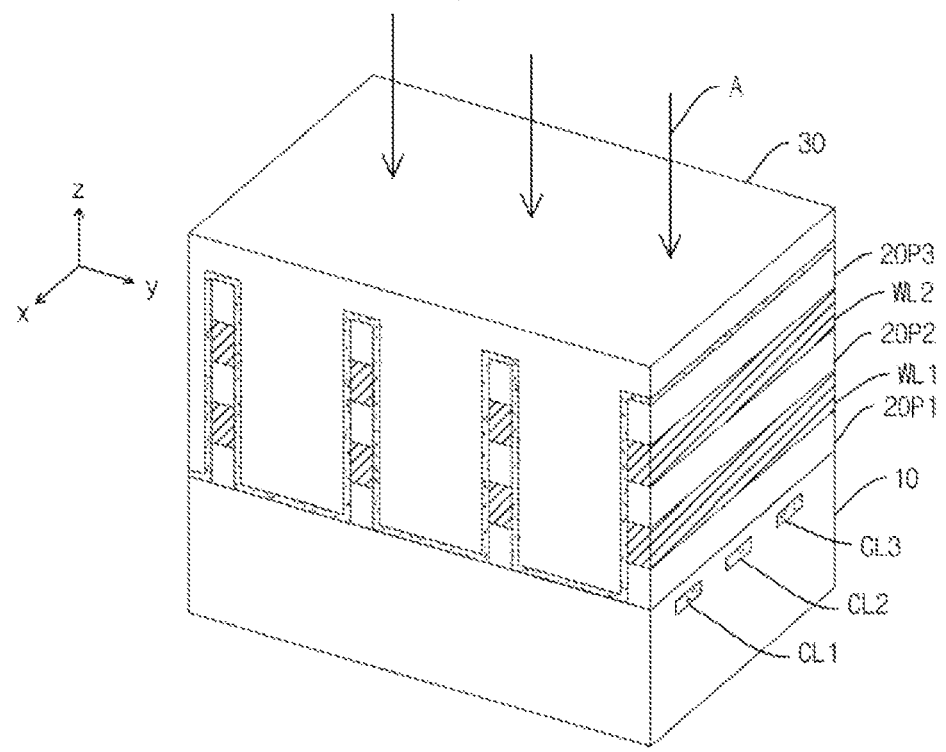
Figure 10F:
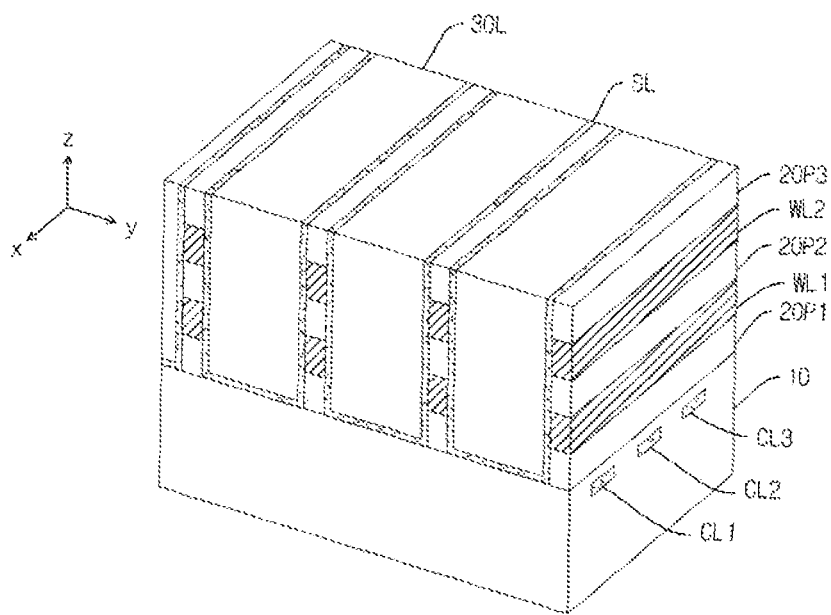

Referring to FIG. 10E, second insulation layers 30 that fill trenches TC between the plurality of wiring stacks ST having formed thereon the data storage material layers SM are formed, and then, as indicated by the arrow A, a planarizing operation may be performed thereto. As shown in FIG. 10E, the planarizing operation may be performed to the topmost patterns 20P3 from among the interlayer insulation layer patterns 20P1, 20P2, and 20P3. However, the present invention is not limited thereto. As a result, as shown in FIG. 10F, the first and second data storage layers SL1 and SL2, which are formed on sidewalls of the plurality of wiring stacks ST and face each others, are defined, and the spaces between the first and second data storage layers SL1 and SL2 may be filled with the second insulation layers 30.

Figure 10G:
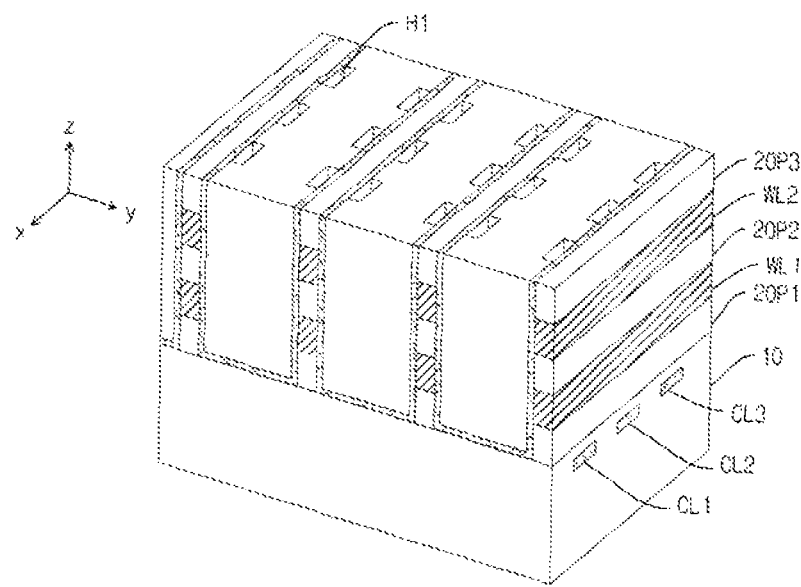
Figure 10H:
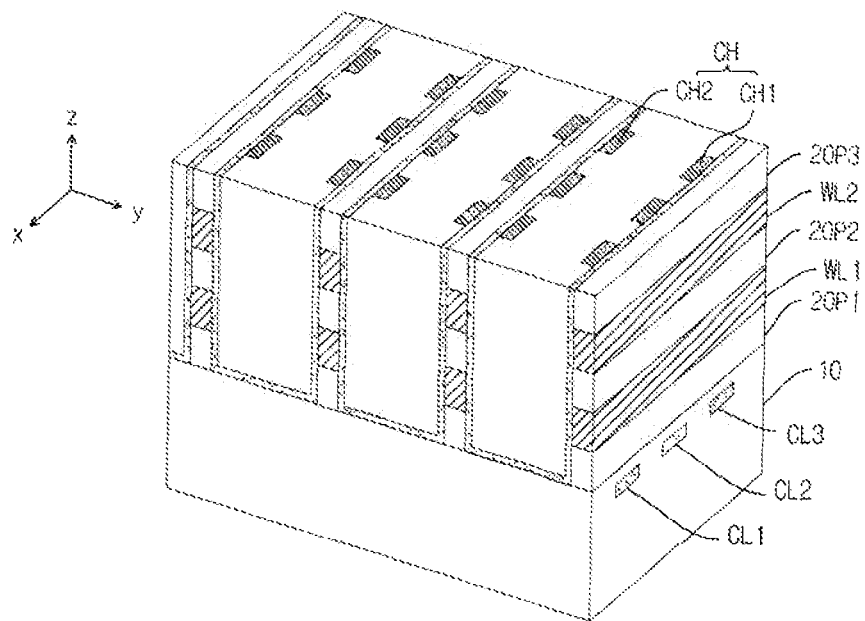

Referring to FIG. 10G, first penetration holes H1 which contact the first data storage layers SL1 and/or the second data storage layers SL2 and penetrate the second insulation layers 30 in a vertical direction (that is, the z-axis direction) are formed. Next, the channel layers CH1 and CH2; CH filling the first penetration holes H1 are formed. Therefore, the channel layers CH1 and CH2; CH which interpose the data storage layers SL1 and SL2; SL with the plurality of conductive lines WL1 and WL2 therebetween and extend across the plurality of conductive lines WL1 and WL2 may be formed.

Figure 10I:
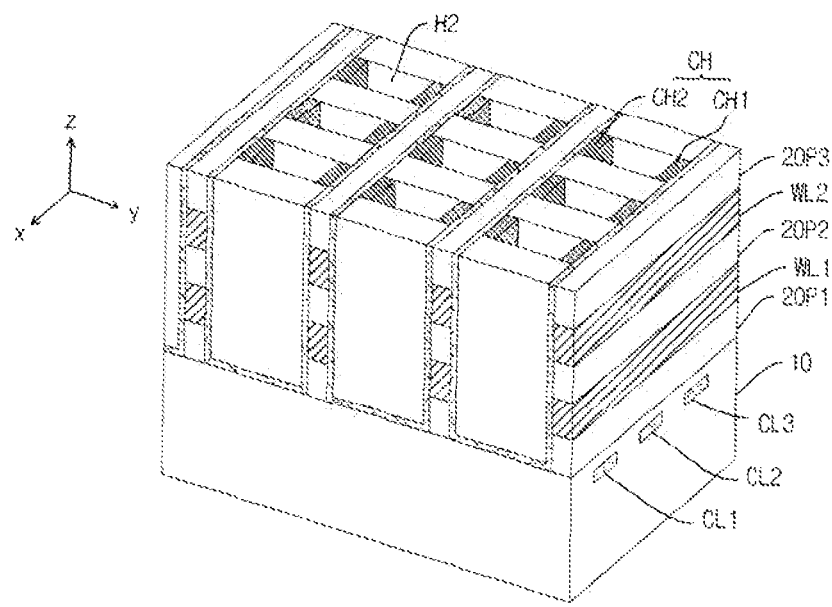

Referring to FIG. 10I, second penetration holes H2 which contact the channel layers CH and penetrate the second insulation layers 30 in a vertical direction (that is, the z-axis direction) are formed. The second penetration holes H2 may penetrate the second insulation layers 30 to a depth at which contact pads CP of the lower rewiring structures CL1, CL2, and CL3 are exposed. In this case, the second penetration holes H2 are formed also to penetrate through the data storage layers SL at the bottom surface of the second insulation layers 30.

According to embodiments of the present invention, as shown in FIG. 10I, the second penetration holes H2 may be formed to contact both the first and second channel layers CH1 and CH2. As a result, as described below, a common gate control structure capable of controlling electric conductivities of both the first and second channel layers CH1 and CH2 may be embodied.

Figure 10J:
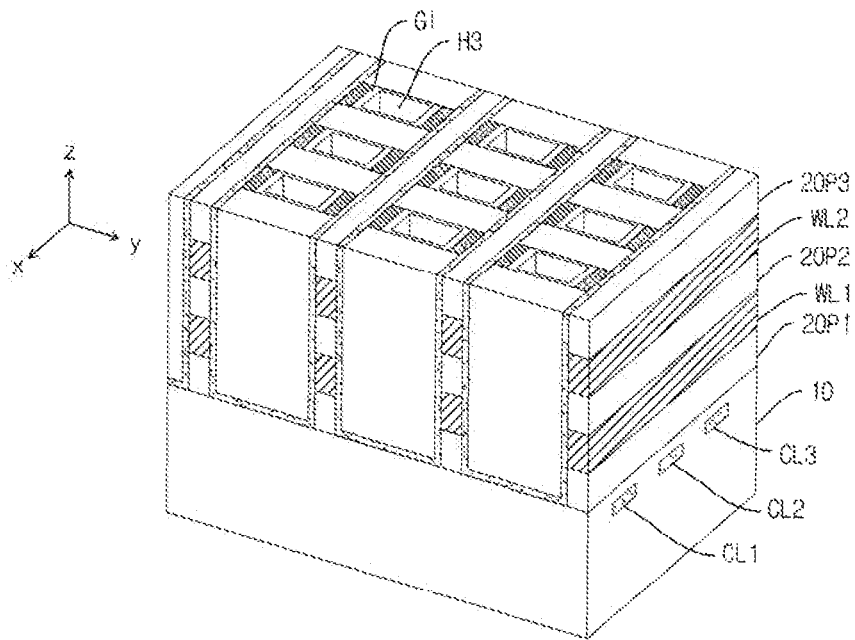

Referring to FIG. 10J, the gate insulation layers GI may be formed on the channel layers CH. As shown in FIG. 10J, the gate insulation layers GI may be formed by conformally depositing insulation layers on sidewalls of the second penetration holes H2. According to embodiments of the present invention, the gate insulation layers GI may be formed by thermally oxidizing surfaces of channel layers H3 exposed in the second penetration holes H2. In this case, the gate insulation layers GI will be locally formed on the channel layers H3 only. Next, gate electrodes (GE of FIG. 7) may be formed by forming conductive layers filling spaces H3 in the second penetration holes H2 defined by the gate insulation layers GI.

Figure 10K:
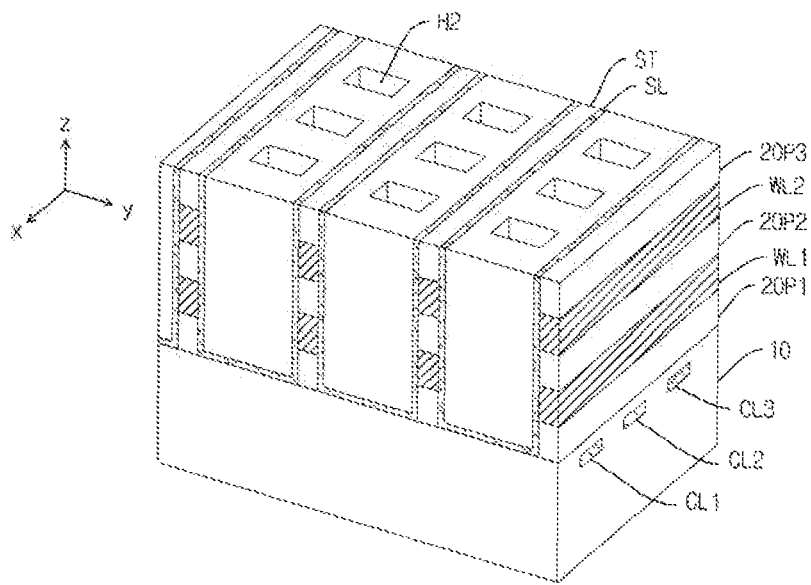
Figure 10I:
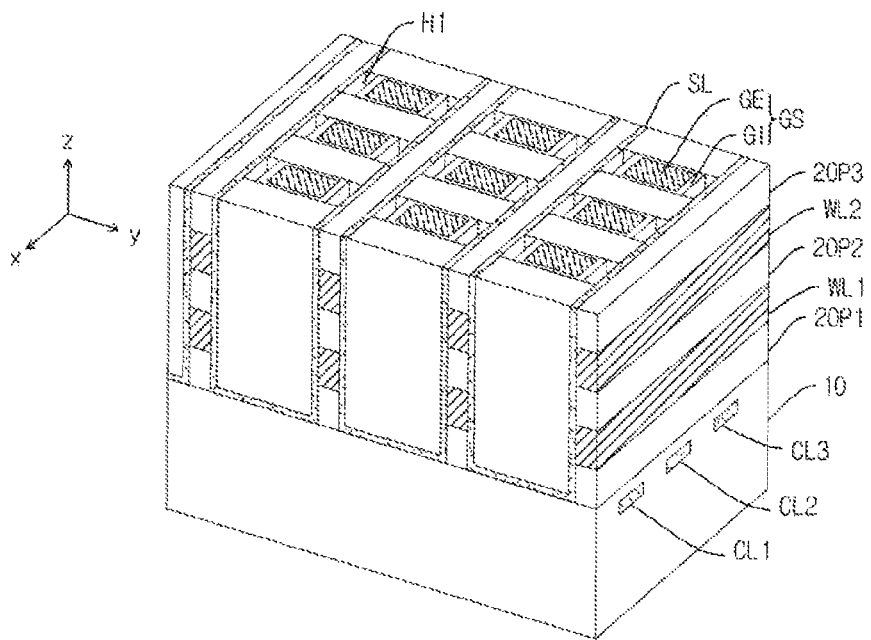

FIGS. 10K and 10L are diagram showing a method of fabricating a non-volatile memory device according to another embodiment of the present invention, which is a method having a sequence different from that of the method shown in FIGS. 10G through 10J. Referring to FIG. 10K, unlike in FIG. 10G, the second penetration holes H2 may be formed before the first penetration holes H1 are formed. Next, Referring to FIG. 10L, the gate insulation layers GI filling the second penetration holes H2 and the gate electrodes GE surrounded by the gate insulation layers GI are formed. Next, he first penetration holes H1 which penetrate the second insulation layers 30 in a vertical direction may be formed to contact the data storage layers SL and the gate insulation layers GI. Next, the channel layers CH may be formed by filling the first penetration holes H1 with a semiconductor material.

As described above, after the channel layers CH and the control gate structures GS are formed, wiring structures for connection to an external circuit may be formed as an occasion demands, thereby completing a non-volatile memory device. Although FIGS. 10A through 10L show the non-volatile memory device 100A shown in FIG. 7, it would have been obvious to one of ordinary skill in the art that the non-volatile memory device 100B as shown in FIG. 7B may be fabricated by further forming suitable upper rewiring structures.

The 3D non-volatile memory device as described above may be embodied in the form of system-on-chip (SOC) by being arranged together with other types of devices, e.g., a logic processor, an image sensor, a RF device, etc., within a single wafer chi. Alternatively, a wafer chip having formed thereon a non-volatile memory device and another wafer chip having formed thereon other types of devices are formed may be adhered to each other by using an adhesive or a wafer bonding technique, thereby embodying a single chip.

Furthermore, the 3D non-volatile memory devices according to the above-stated embodiments may be embodied as any of various types of semiconductor packages. For example, 3D non-volatile memory devices according to embodiments of the present invention may be packaged as package on package (PoP), ball grid arrays (BGAs), chip scale packages (CSPs), plastic leaded chip carrier (PLCC), plastic dual in-line package (PDIP), die in waffle pack, die in wafer FoSM, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP). Packages on which 3D non-volatile memory devices according to embodiments of the present invention are mounted may further include controllers and/or logic devices for controlling the non-volatile memory devices.

Figure 11:
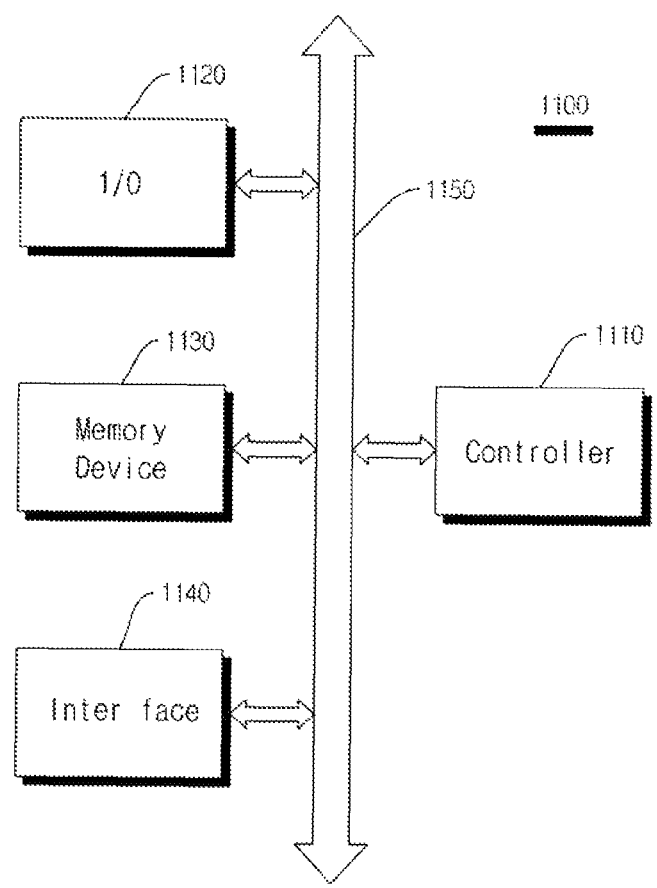
FIG. 11 is a block diagram showing a electronic system including a non-volatile memory device according to an embodiment of the present invention.

FIG. 11 is a block diagram showing an electronic system 1100 including a non-volatile memory device according to an embodiment of the present invention.

Referring to FIG. 11, the electronic system 1100 may include a controller 1110, an I/O device 1120, a memory device 1130, an interface 1140, and a bus 1150. The controller 1110, the I/O device 1120, the memory device 1130, and/or the interface 1140 may be combined with one another via the bus 1150.

The controller 1110 may include at least one from among a microprocessor, a digital signal processor, a micro controller, and other logic devices providing similar functions. The I/O device 1120 may include a keypad, a keyboard, a display device, etc. The memory device 1130 may store data and/or instructions. The memory device 1130 may include at least one from among the 3D non-volatile memory devices according to the above-stated embodiments of the present invention. Furthermore, the memory device 1130 may have a hybrid structure further including other types of semiconductor memory devices (e.g., DRAM devices and/or SRAM devices). The interface 1140 may transmit data to a communication network or receive data from a communication network. The interface 1140 may be a wired interface or a wireless interface. For example, the interface 1140 may include an antenna or a wired/wireless transceiver. Although not shown, the electronic system 1100 further include a high speed DRAM and/or SRAM as an operation memory for improving operation of the controller 1110.

The electronic system 1100 may be applied to a personal digital assistant (PDA), a portable computer, a tablet PC, a wireless phone, a mobile phone, a digital music player, a memory card, or any of various other electronic devices capable of transmitting and/or receiving data wirelessly.

Figure 12:
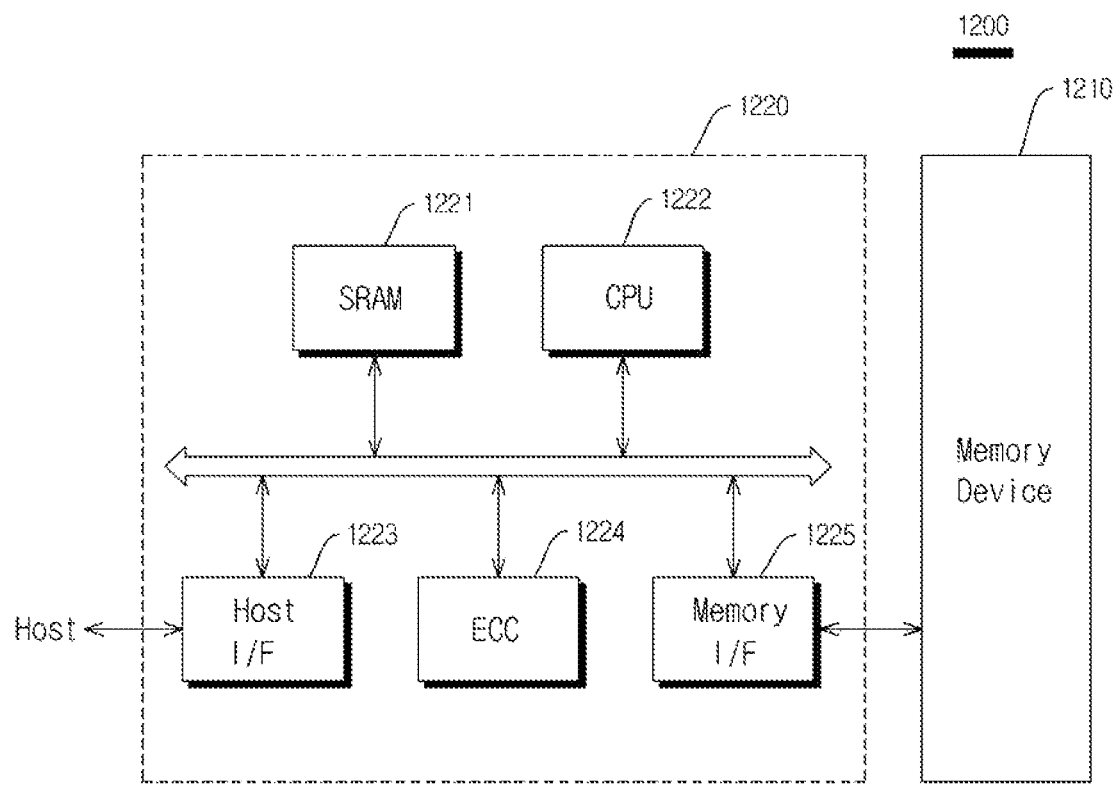
FIG. 12 is a block diagram showing a memory card including a non-volatile memory device according to an embodiment of the present invention.

FIG. 12 is a block diagram showing a memory card 1200 including a non-volatile memory device according to an embodiment of the present invention.

Referring to FIG. 12, the memory card 1200 includes a memory device 1210. The memory device 1210 may include at least one from among the 3D non-volatile memory devices according to the above-stated embodiments of the present invention. Furthermore, the memory device 1210 may further include other types of semiconductor memory devices (e.g., DRAM devices and/or SRAM devices). The memory card 1200 may include a memory controller 1220 which controls data exchange between a host and the memory device 1210.

The memory controller 1220 may include a processing unit 1222 which controls the overall operations of the memory card 1200. Furthermore, the memory controller 1220 may also include a SRAM 1221, which is used as an operation memory of the processing unit 1222. Furthermore, the memory controller 1220 may further include a host interface 1223 and a memory interface 1225. The host interface 1223 may include a protocol for data exchange between the memory card 1200 and the host. The memory interface 1225 may connect the memory controller 1220 to the memory device 1210. Furthermore, the memory controller 1220 may further include an error correcting block (ECC) 1224. The ECC 1224 may detect and correct errors of data read out from the memory device 1210. Although not shown, the memory card 1200 may further include a ROM device for storing code data for interfacing with the host. The memory card 1200 may be used as a portable data storage card.

The non-volatile memory device may be embodied as a solid state disk (SSD) which may replace a hard disk drive of a computer system. In this case, a 3D non-volatile memory device according to an embodiment of the present invention may be highly integrated, thereby providing petascale computing performance and enabling high speed data input and output.

According to embodiments of the present invention, memory cells are defined by crossing a plurality of linear conductive lines and a plurality of planar conductive planes, thereby providing a crossbar type 3D array structure. Therefore, 3D memory cell array may be designed up to $4F^2$, and a simple and highly integrated 3D non-volatile memory device may be provided.

Furthermore, according to a method of fabricating 3D non-volatile memory devices according to an embodiment of the present invention, a 3D non-volatile memory device having the above-stated advantages may be easily and reliably fabricated by forming a plurality of conductive lines, a plurality of non-volatile data storage layer patterns, and a plurality of conductive planes.

Furthermore, according to a non-volatile memory device according to another embodiment of the present invention, by configuring signal lines to be identical with as bit lines by virtue of channel layers and control gate electrodes for controlling electric conductivities of the channel layers, crosstalks between memory cells adjacent to one another may be prevented without combining rectification devices, such as diodes, to 3-dimensionally arranged non-volatile memory cells, and thus a highly integrated 3D non-volatile memory device may be provided.

Furthermore, according to a method of fabricating 3D non-volatile memory devices according to another embodiment of the present invention, a non-volatile memory device may be easily and reliably fabricated due to the above-stated advantages of the non-volatile memory devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A 3D non-volatile memory device comprising:
a plurality of conductive lines separated from one another in parallel;
a plurality of conductive planes extending across the plurality of conductive lines and are separated from one another in parallel;
non-volatile data storage layer patterns, each arranged at regions of intersection at which the plurality of conductive lines and the plurality of conductive planes cross each others; and
selection diode layer patterns connected to the non-volatile data storage layer pattern in series by stacking the selection diode layer pattern and the non-volatile data storage layer pattern on each other, between the regions of intersection,
wherein at least one of the non-volatile data storage layer patterns and the selection diode layer patterns surround the plurality of conductive lines.

2. The 3D non-volatile memory device of claim 1, wherein the non-volatile data storage layer pattern comprises a phase change material, a variable resistive material, a programmable metallization cell (PMC), a magnetic material, or a combination thereof.

3. The 3D non-volatile memory device of claim 1, further comprising insertion electrode layers between the non-volatile data storage layer patterns and the selection diode layer patterns.

4. A 3D non-volatile memory device comprising:
- a plurality of conductive lines, which include linear patterns that extend on a substrate in a first direction parallel to the main surface of the substrate and are 3-dimensionally arranged by being arranged in parallel with one another and separated from one another in a second direction and a third direction different from the first direction;
- a plurality of conductive planes, which extend on the substrate in the second direction and the third direction, are separated from one another in parallel in the first direction, and cross the plurality of conductive lines;
- insulation layer patterns, which are arranged between the plurality of conductive planes;
- non-volatile data storage layer patterns, which are respectively arranged at regions of intersection at which the plurality of conductive lines and the plurality of conductive planes cross each others; and
- selection diode layer patterns connected to the non-volatile data storage layer pattern in series by stacking the selection diode layer pattern and the non-volatile data storage layer pattern on each other, between the regions of intersection,
- wherein at least one of the non-volatile data storage layer patterns and the selection diode layer patterns surround the plurality of conductive lines.

5. The 3D non-volatile memory device of claim 4, wherein the non-volatile data storage layer pattern comprises a phase change material, a variable resistive material, a programmable metallization cell (PMC), a magnetic material, or a combination thereof.

6. The 3D non-volatile memory device of claim 4, further comprising supporting structures, wherein each supporting structure penetrates insulation layer patterns and then also penetrates the plurality of conductive lines.

7. A method of fabricating a 3D non-volatile memory device, the method comprising:
- forming a plurality of conductive lines, which are separated from one another in parallel;
- forming a plurality of non-volatile data storage layer patterns on the plurality of conductive lines;
- forming a plurality of conductive planes, which extend across the plurality of conductive lines and are separated from one another in parallel, such that regions of intersection, at which the plurality of conductive lines and the plurality of conductive planes cross each other, are defined on the non-volatile data storage layer patterns; and
- forming selection diode layer patterns connected to the non-volatile data storage layer pattern in series by stacking the selection diode layer pattern and the non-volatile data storage layer pattern on each other, between the regions of intersection,
- wherein at least one of the non-volatile data storage layer patterns and the selection diode layer patterns surround the plurality of conductive lines.

8. The method of claim 7, wherein the forming of the non-volatile data storage layer patterns comprises:
- forming non-volatile data storage layers on the plurality of conductive lines; and
- forming the non-volatile data storage layer patterns by patterning the non-volatile data storage layers at a constant interval.

9. The method of claim 7, wherein the non-volatile data storage layer pattern comprises a phase change material, a variable resistive material, a programmable metallization cell (PMC), a magnetic material, or a combination thereof.

* * * * *